United States Patent
Kubo et al.

(10) Patent No.: US 11,575,095 B2
(45) Date of Patent: Feb. 7, 2023

(54) PHOTOELECTRIC CONVERSION DEVICE, PROCESS CARTRIDGE, AND IMAGE FORMING APPARATUS

(71) Applicant: RICOH COMPANY, LTD., Tokyo (JP)

(72) Inventors: Daisuke Kubo, Shizuoka (JP); Hidetoshi Kami, Shizuoka (JP); Suzuka Nozoe, Kanagawa (JP); Tomoharu Asano, Kanagawa (JP); Tetsuya Toshine, Shizuoka (JP); Nozomu Tamoto, Shizuoka (JP); Yuuji Tanaka, Shizuoka (JP); Naomichi Kanei, Shizuoka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/981,890

(22) PCT Filed: Jan. 22, 2019

(86) PCT No.: PCT/JP2019/001845
§ 371 (c)(1),
(2) Date: Sep. 17, 2020

(87) PCT Pub. No.: WO2019/181176
PCT Pub. Date: Sep. 26, 2019

(65) Prior Publication Data
US 2021/0003931 A1   Jan. 7, 2021

(30) Foreign Application Priority Data

Mar. 19, 2018 (JP) .............................. JP2018-050951
Aug. 29, 2018 (JP) .............................. JP2018-160017

(51) Int. Cl.
*G03G 5/147* (2006.01)
*G03G 5/043* (2006.01)
(Continued)

(52) U.S. Cl.
CPC ....... *H01L 51/4226* (2013.01); *G03G 5/0436* (2013.01); *G03G 5/14704* (2013.01);
(Continued)

(58) Field of Classification Search
CPC . G03G 5/0696; G03G 5/0436; G03G 5/14704
(Continued)

(56) References Cited

U.S. PATENT DOCUMENTS 4,477,549 A * 10/1984 Fujimaki .............. G03G 5/0436
430/57.2
4,804,607 A *  2/1989 Atsumi .............. G03G 5/14704
430/128
(Continued)

FOREIGN PATENT DOCUMENTS

CN        102326260       1/2012
CN        104521022       4/2015
(Continued)

OTHER PUBLICATIONS

Abstract of CN 110395769; Zhao et al, Nov. 1, 2019.*
(Continued)

*Primary Examiner* — Peter L Vajda
*Assistant Examiner* — Boone Alexander Evans
(74) *Attorney, Agent, or Firm* — Grüneberg and Myers, PLLC

(57) ABSTRACT

Provided is a photoelectric conversion device including: a support; a charge-transporting layer including an organic charge-transporting material or a sensitizing dye electrode layer including an organic sensitizing dye, where the charge-transporting layer or the sensitizing dye electrode layer is disposed on the support; and a ceramic film disposed on the charge-transporting layer or the sensitizing dye electrode layer.

12 Claims, 5 Drawing Sheets

(51) Int. Cl.
  *H01L 51/42* (2006.01)
  *H01G 9/20* (2006.01)
  *H01L 51/44* (2006.01)
  *H01L 51/52* (2006.01)
  *G03G 5/05* (2006.01)
  *G03G 5/06* (2006.01)

(52) U.S. Cl.
  CPC ......... *H01G 9/2059* (2013.01); *H01L 51/448* (2013.01); *H01L 51/5253* (2013.01); *G03G 5/0564* (2013.01); *G03G 5/0672* (2013.01); *G03G 5/0696* (2013.01)

(58) Field of Classification Search
  USPC .......................................................... 430/66
  See application file for complete search history.

(56) References Cited

U.S. PATENT DOCUMENTS

| | | | |
|---|---|---|---|
| 5,242,773 A * | 9/1993 | Iino | G03G 5/14704 430/58.05 |
| 5,627,406 A | 5/1997 | Pace | |
| 5,932,362 A | 8/1999 | Nagai et al. | |
| 6,507,147 B1 | 1/2003 | Costello | |
| 9,318,270 B2 | 4/2016 | Horiuchi et al. | |
| 9,373,450 B2 | 6/2016 | Arai et al. | |
| 9,378,899 B2 | 6/2016 | Arai et al. | |
| 9,640,330 B2 | 5/2017 | Tanaka et al. | |
| 2003/0025180 A1 | 2/2003 | Alcoe et al. | |
| 2007/0125449 A1 | 6/2007 | Kajiwara et al. | |
| 2009/0242887 A1 | 10/2009 | Yamamoto et al. | |
| 2010/0175755 A1* | 7/2010 | Singh | H01L 51/4226 136/258 |
| 2010/0252108 A1 | 10/2010 | Singh et al. | |
| 2011/0011447 A1 | 1/2011 | Harimoto et al. | |
| 2013/0157182 A1* | 6/2013 | Fujita | G03G 5/0433 430/57.1 |
| 2013/0280521 A1 | 10/2013 | Mori | |
| 2013/0344422 A1* | 12/2013 | Iwanaga | G03G 5/047 399/159 |
| 2014/0225710 A1 | 8/2014 | Feichtinger et al. | |
| 2015/0200378 A1 | 7/2015 | Reusch et al. | |
| 2016/0163618 A1 | 6/2016 | Tani et al. | |
| 2016/0293342 A1 | 10/2016 | Yumoto et al. | |
| 2017/0033097 A1 | 2/2017 | Sumi et al. | |
| 2017/0069431 A1 | 3/2017 | Tanaka et al. | |
| 2017/0092433 A1 | 3/2017 | Kanei et al. | |
| 2017/0093150 A1 | 3/2017 | Sumi et al. | |
| 2017/0162467 A1 | 6/2017 | Ellis | |
| 2017/0222150 A1 | 8/2017 | Arai et al. | |
| 2017/0243698 A1 | 8/2017 | Kanei et al. | |
| 2017/0307988 A1 | 10/2017 | Asano et al. | |
| 2017/0343908 A1 | 11/2017 | Takahashi et al. | |
| 2017/0343910 A1 | 11/2017 | Ishida et al. | |
| 2017/0358399 A1 | 12/2017 | Matsuyama et al. | |
| 2018/0053863 A1 | 2/2018 | Tanaka et al. | |
| 2018/0113403 A1 | 4/2018 | Kami et al. | |
| 2018/0197688 A1 | 7/2018 | Horiuchi et al. | |
| 2018/0198083 A1 | 7/2018 | Tanaka et al. | |
| 2018/0330890 A1 | 11/2018 | Tanaka et al. | |
| 2019/0011845 A1 | 1/2019 | Toshine et al. | |

FOREIGN PATENT DOCUMENTS

| | | |
|---|---|---|
| JP | 63-91666 | 4/1988 |
| JP | 04-152186 | 5/1992 |
| JP | 2728518 | 12/1997 |
| JP | 2000150166 | 5/2000 |
| JP | 2001-024106 | 1/2001 |
| JP | 2001-152361 | 6/2001 |
| JP | 2001-523390 | 11/2001 |
| JP | 2001-352011 | 12/2001 |
| JP | 2002-140837 | 5/2002 |
| JP | 2002-373908 | 12/2002 |
| JP | 2003-257839 | 9/2003 |
| JP | 2004-101997 | 4/2004 |
| JP | 3660841 | 3/2005 |
| JP | 3834632 | 8/2006 |
| JP | 2007-109829 | 4/2007 |
| JP | 2008077843 | 4/2008 |
| JP | 2008-180937 | 8/2008 |
| JP | 2008-291285 | 12/2008 |
| JP | 4437919 | 1/2010 |
| JP | 4609296 | 10/2010 |
| JP | 4665044 | 1/2011 |
| JP | 2011-100879 | 5/2011 |
| JP | 2011-176088 | 9/2011 |
| JP | 2012-115771 | 6/2012 |
| JP | 5025068 | 6/2012 |
| JP | 5313478 | 7/2013 |
| JP | 5352878 | 9/2013 |
| JP | 2014-186047 | 10/2014 |
| JP | 5761203 | 6/2015 |
| JP | 2015-141269 | 8/2015 |
| JP | 2015169870 A * | 9/2015 |
| JP | 5813227 | 10/2015 |
| JP | 2017-090608 | 5/2017 |
| JP | 2017-520921 | 7/2017 |
| JP | 6183760 | 8/2017 |
| WO | WO2010/071893 A2 | 6/2010 |
| WO | 2013/161165 | 10/2013 |
| WO | WO2015/022994 A1 | 2/2015 |
| WO | WO2015/190404 A1 | 12/2015 |
| WO | WO2015/198833 A1 | 12/2015 |

OTHER PUBLICATIONS

"Machine Translation of the description of publication # JP 2015169870 A" (Year: 2015).*

Jong-Chul Lee, Se-Young Um, Young-Woo Heo, Joon-Hyung Lee, Jeong-Joo Kim, "Phase development and crystallization of CuAlO2 thin films prepared by pulsed laser deposition", Jun. 18, 2009, School of Materials Science and Engineering, Kyungpook National University, Daegu 702-701, Republic of Korea, Fig. 1 (Year: 2009).*

Lee Y. M., et al., "Preparation and characterization of solid n-TiO$_2$/p-NiO hetrojunction electrodes for all-solid-state dye-sensitized solar cells", Solid State Electronics, Elsevier Science Publishers, Barking, GB, vol. 53, No. 10, Oct. 1, 2009, pp. 1116-1125, XP026468078, ISSN: 0038-1101, DOI: 10.1016/J.SSE.2009.07.004.

Kenneth Hanson, et al., "Stabilization of [Ru(bpy)$_2$(4,4'-(PO$_3$H$_2$)bpy)]$^{2+}$ on Mesoporous TiO$_2$ with Atomic Layer Deposition of Al$_2$O$_3$", Chemistry of Materials, vol. 25, Dec. 7, 2012, pp. 3-5, XP002790302.

International Search Report dated Apr. 15, 2019 for counterpart International Patent Application No. PCT/JP2019/001845 filed Jan. 22, 2019.

Written Opinion dated Apr. 15, 2019 for counterpart International Patent Application No. PCT/JP2019/001845 filed Jan. 22, 2019.

Chinese Office Action dated Jul. 26, 2021 in Chinese Application No. 201980026964.4 with translation.

Bandara et al., "p-type oxide semiconductors as hole collectors in dye-sensitized solid-state solar cells", Semiconductor Science and Technology, vol. 22, 2007, pp. 20-24.

Korean Office Action dated Jan. 19, 2022 in Korean Application No. 10-2020-7029316, with English translation, 13 pages.

Japanese Office Action dated May 10, 2022 in Japanese Application No. 2018-160017, with English translation, 8 pages.

Final Rejection dated Oct. 18, 2022 from the Korean Intellectual Property Office in Korean Patent Application No. 10-2020-7029316, with English translation, 5 pages.

Decision of Refusal of Amendment dated Oct. 18, 2022 from the Korean Intellectual Property Office in Korean Patent Application No. 10-2020-7029316, with English translation, 8 pages.

* cited by examiner

[Fig. 1]
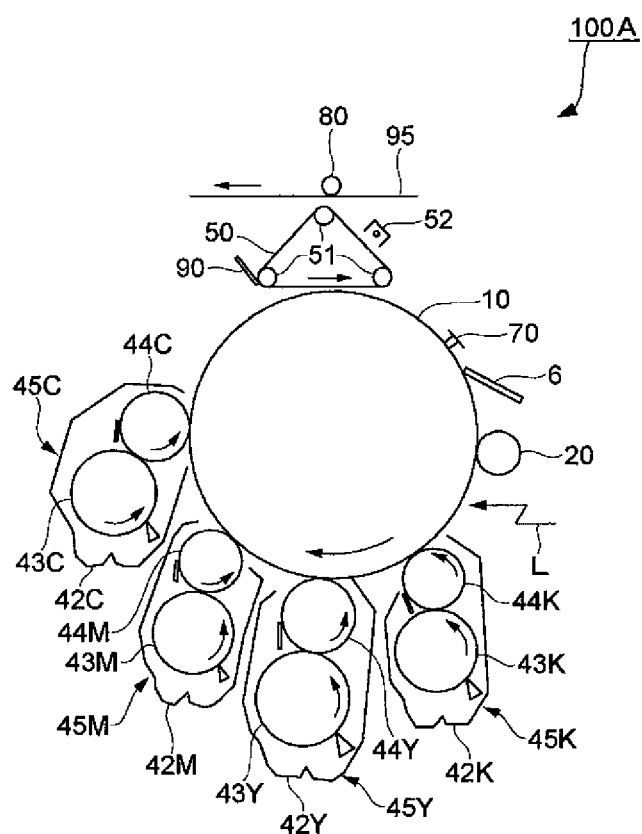

[Fig. 2]
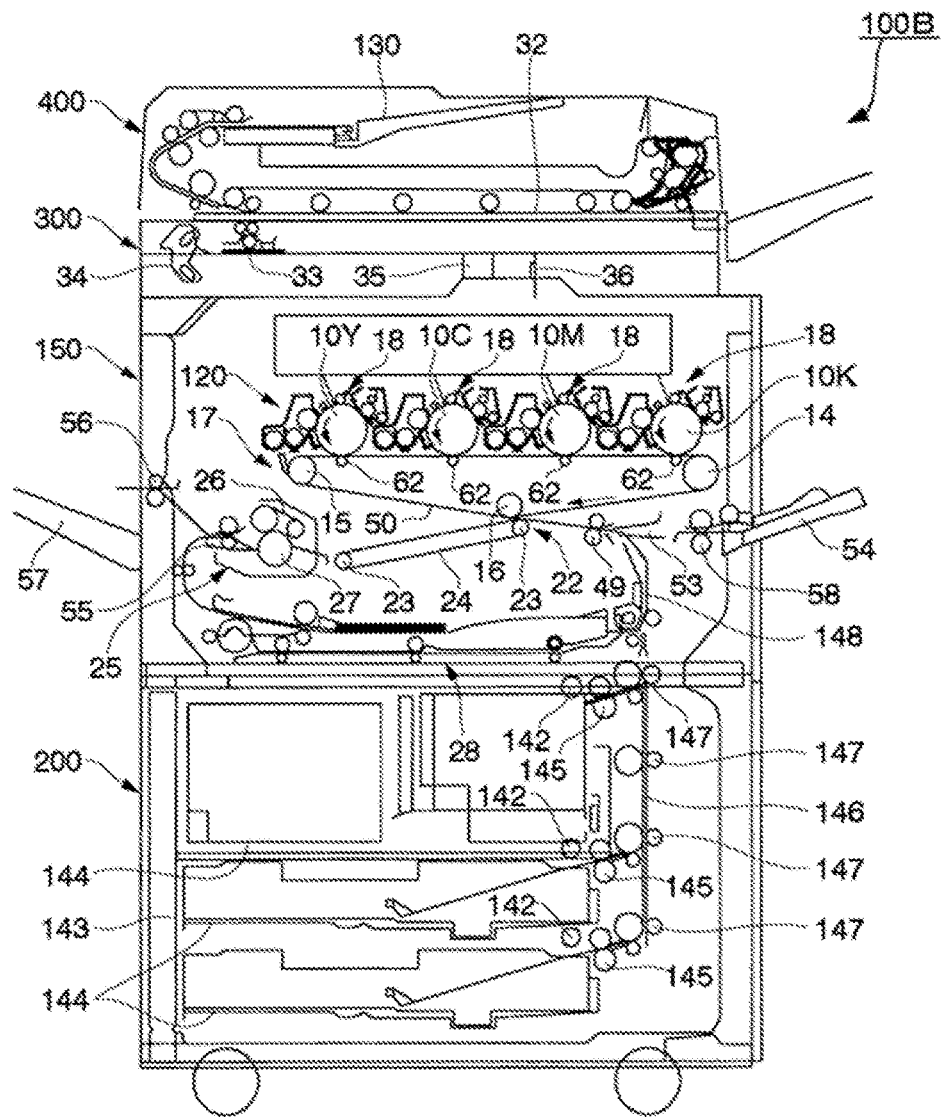
[Fig. 3]
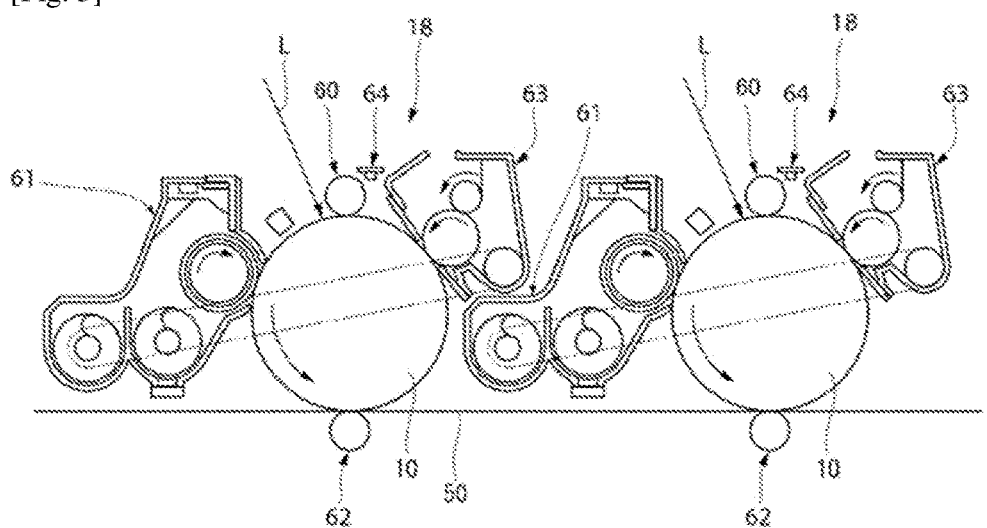

[Fig. 4]
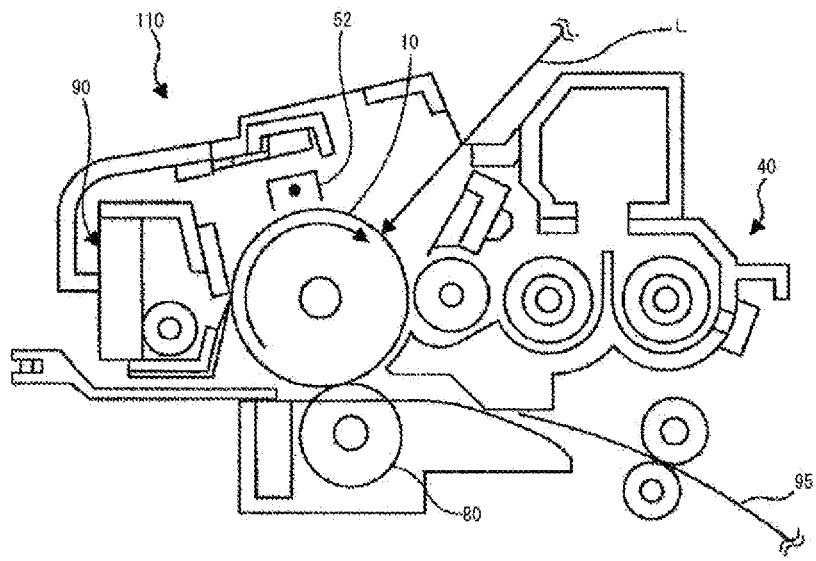
[Fig. 5]
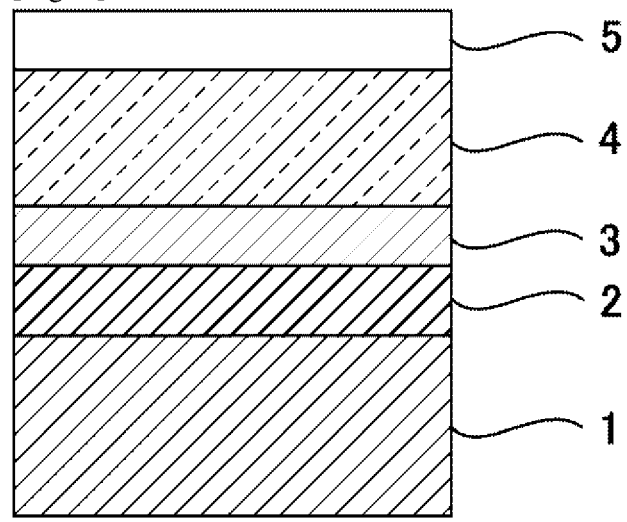

[Fig. 6]
10B
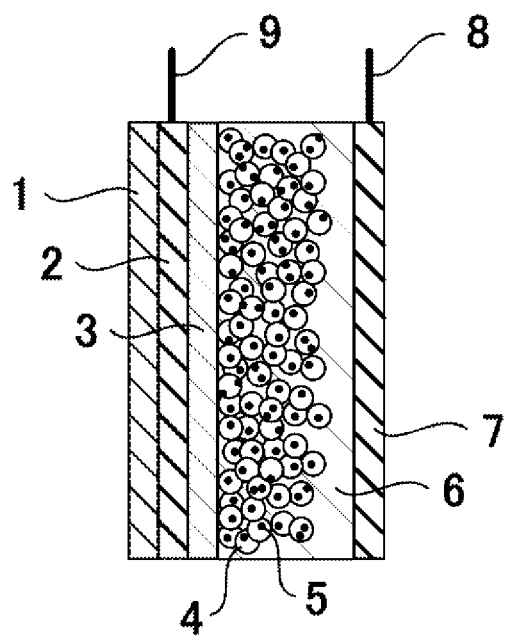
[Fig. 7]
10C
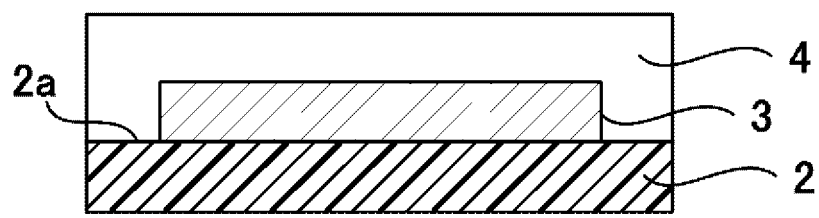

[Fig. 8]
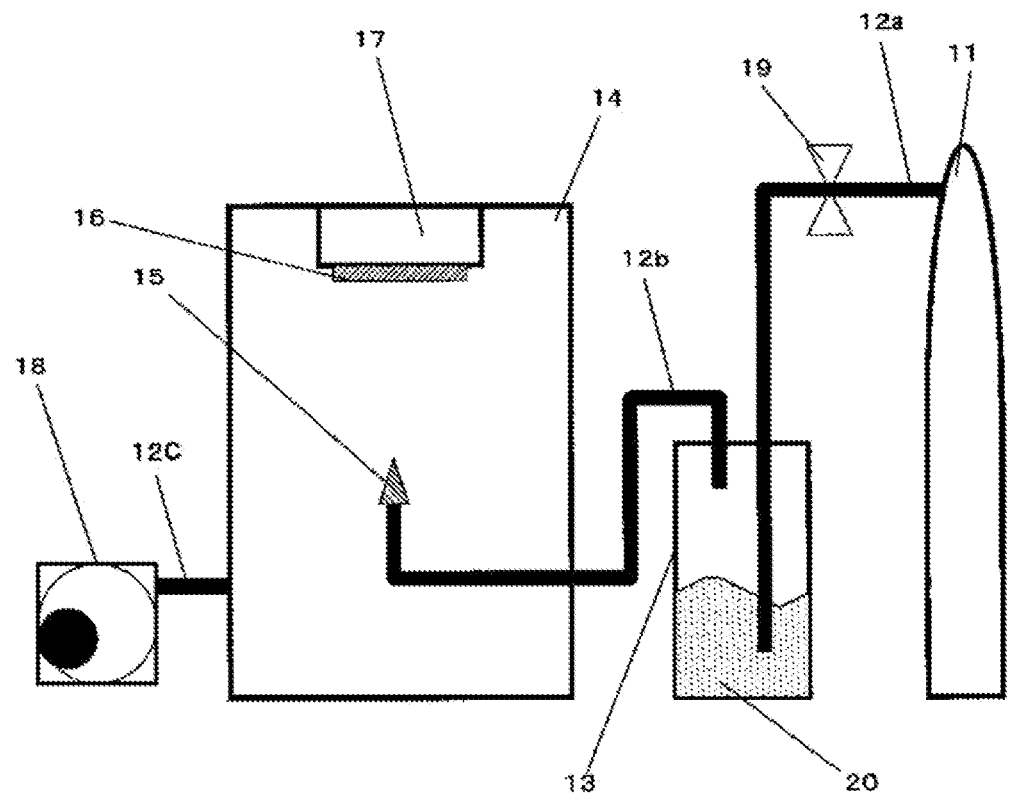
[Fig. 9]
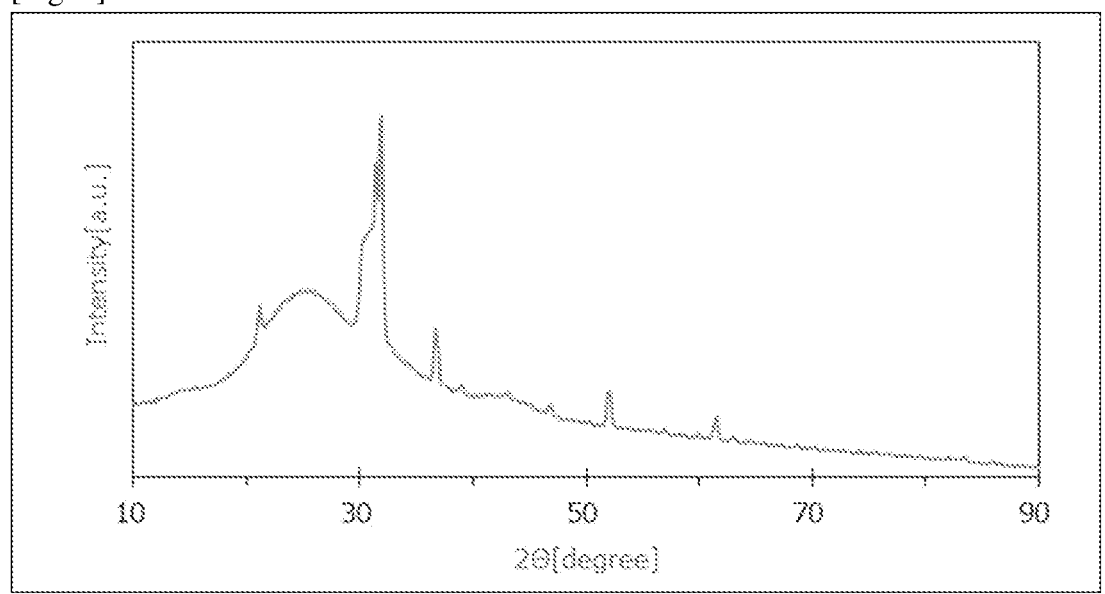

PHOTOELECTRIC CONVERSION DEVICE, PROCESS CARTRIDGE, AND IMAGE FORMING APPARATUS

TECHNICAL FIELD

The present disclosure relates to a photoelectric conversion device, a process cartridge, and an image forming apparatus.

BACKGROUND ART

In recent years, photoelectric conversion devices each including an organic semiconductor have been developed and have become available on market.

Currently, most of widely used photoelectric conversion devices, such as electrophotographic photoconductors, are photoelectric conversion devices formed of an organic material. Such an electrophotographic photoconductor formed of an organic material has a problem that the organic material gradually deteriorates due to electrostatic hazard to generate charge trap within a layer or change charging properties or optical attenuation to thereby degrade electrical properties of the electrophotographic photoconductor, as charging and charge elimination are repeatedly performed using the electrophotographic photoconductor.

Moreover, dye-sensitized solar battery cells each including an organic sensitizing dye have been developed as organic solar battery cells whose cost is lower than silicon-based solar battery cells.

Since the dye-sensitized solar battery cell includes an organic sensitizing dye that is an organic material, however, materials for use are deteriorated by a temperature, humidity, or gas, such as ozone, NOx, and ammonia, compared to the silicon-based solar battery cell. As a result, functions thereof tend to degrade. Therefore, the dye-sensitized solar battery cell has a problem that the dye-sensitized solar battery cell is inferior to a silicon-based solar battery cell in view of durability.

Within a display element, such as an organic electroluminescence (EL) element, a light emitting diode display element, a liquid crystal display element, and an electrophoretic ink display element, a display element, such as an organic EL light-emitting layer sandwiched between a positive electrode and a negative electrode, is disposed and formed on a substrate. An organic EL display device is expected to be a display device of the next generation because the organic EL display device has the wider view angle and the faster response speed compared to liquid crystal display devices, and three are varieties of luminescence organic materials have.

As a formation method of the above-mentioned organic EL element, a formation method using coating has been used in view of productivity and cost. Moreover, the organic EL element has a problem that the organic EL element tends to deteriorate due to exposure to heat, moisture, or gas, such as oxygen, and therefore a service life of the organic EL element becomes short.

As an electrophotographic photoconductor having excellent abrasion resistance and stability of image properties, for example, PTL 1 discloses an electrophotographic photoconductor, in which particulate ceramic serving as p-type semiconductor particles is included in a protective layer.

For example, moreover, PTL 2 discloses that an electrophotographic photoconductor has high sensitivity to an exposure light source of a short wavelength region, where the electrophotographic photoconductor includes a charge-generating layer formed of metal oxide including nitrogen, and the charge-generating layer is disposed on a support a surface layer of which has conductivity.

For example, moreover, PTL 3 discloses a production method of a compound semiconductor film, where the production method includes a film formation step including forming a compound semiconductor film on a substrate by an aerosol deposition method.

CITATION LIST

Patent Literature

PTL 1: Japanese Unexamined Patent Application Publication No. 2015-141269
PTL 2: Japanese Unexamined Patent Application Publication No. 2008-180937
PTL 3: Japanese Unexamined Patent Application Publication No. 2011-100879

SUMMARY OF INVENTION

Technical Problem

The present disclosure has an object to provide a photoelectric conversion device, which is obtained with low cost, and is highly durable without varying properties against external stimuli, such as temperature changes, exposure to gas, and humidity changes.

Solution to Problem

According to one aspect of the present disclosure, a photoelectric conversion device including a support, a charge-transporting layer including an organic charge-transporting material or a sensitizing dye electrode layer including an organic sensitizing dye, and a ceramic film. The charge-transporting layer or the sensitizing dye electrode layer is disposed on the support. The ceramic film is disposed on the charge-transporting layer or the sensitizing dye electrode layer.

Advantageous Effects of Invention

The present disclosure can provide a photoelectric conversion device, which is obtained with low cost, and is highly durable without varying properties against external stimuli, such as temperature changes, exposure to gas, and humidity changes.

BRIEF DESCRIPTION OF DRAWINGS

FIG. 1 is a schematic structural view illustrating one example of an image forming apparatus of the present disclosure.

FIG. 2 is a schematic structural view illustrating another example of the image forming apparatus of the present disclosure.

FIG. 3 is a schematic structural view illustrating one example of an image forming unit of each color.

FIG. 4 is a schematic structural view illustrating one example of a process cartridge of the present disclosure.

FIG. 5 is a cross-sectional view illustrating one example of the photoelectric conversion device (electrophotographic photoconductor) of the present disclosure.

FIG. 6 is a cross-sectional view illustrating one example of the photoelectric conversion device (solar battery cell) of the present disclosure.

FIG. 7 is a cross-sectional view illustrating one example of the photoelectric conversion device (organic EL element) of the present disclosure.

FIG. 8 is a schematic structural view illustrating one example of an aerosol deposition device used when a ceramic film of the present disclosure is formed.

FIG. 9 is a graph depicting one example of a result of a measurement of an X-ray diffraction spectrum of copper aluminium oxide.

DESCRIPTION OF EMBODIMENTS (Photoelectric Conversion Device)

A photoelectric conversion device of the present disclosure includes a support, a charge-transporting layer including an organic charge-transporting material or a sensitizing dye electrode layer including an organic sensitizing dye, where the charge-transporting layer or the sensitizing dye electrode layer is disposed on the support, and a ceramic film disposed on the charge-transporting layer or the sensitizing dye electrode layer.

The photoelectric conversion device is not particularly limited and may be appropriately selected depending on the intended purpose. Examples of the photoelectric conversion device include devices, such as an electrophotographic photoconductor, a solar battery cell, an organic electroluminescence (EL) element, a transistor, an integrated circuit, a laser diode, and a light emitting diode.

The photoelectric conversion device of the present disclosure has been accomplished by finding the following problems existing in the art and finding out that the photoelectric conversion device of the present disclosure can solve the problems.

There is an attempt to reduce image defects due to use of an electrophotographic photoconductor that is a photoelectric conversion device over a long period and numerous developments associated with a prolonged service life of the electrophotographic photoconductor have been reported. In order to achieve a prolonged service life of an electrophotographic photoconductor, it is important to improve durability of the electrophotographic photoconductor against various hazards the electrophotographic photoconductor receives during image formation.

The hazards are roughly classified into mechanical hazards and chemical hazards.

As one example of the chemical hazards, known are hazards caused by acidic gas or alkaline gas generated at the time when a surface of the electrophotographic photoconductor is charged and applied with electric charge. Acidic gas, such as ozone, nitrogen, and oxide, is generated near a charger (see, for example, J. Imaging Science Vol. 5, 205 (1988)), When an electrophotographic photoconductor is exposed to acidic gas, a charge-transporting material (e.g., a hole-transporting material and an electron-transporting material) included in the electrophotographic photoconductor is deteriorated by the acidic gas (see, for example, KONICA TECHNICAL REPORT VOL. 13 (2000) "Influence of nitrogen oxide over resolution of OPC"), and therefore properties of the electrophotographic photoconductor are impaired. When an electrophotographic photoconductor of a short service life is used, deterioration caused by acidic gas often occurs only in an outermost surface layer of the electrophotographic photoconductor and an amount of a deteriorated component remands small. When an electrophotographic photoconductor of a long service life is used, however, deterioration may reach an inner part of the electrophotographic photoconductor. As a result, reduction in image density or background smear may occur, and therefore high quality image output cannot be maintained at the time of use over a long period.

In order to solve the problem associated with chemical hazards, proposed is a technique where an antioxidant is added to a charge-transporting layer or a surface layer to prevent deterioration of a charge-transporting material due to acidic gas. In order to prevent acidic gas from penetrating into a charge-transporting layer or a surface layer, moreover, proposed is a technique to lower gas permeability of the charge-transporting layer or the surface layer. Moreover, proposed is a technique where generation of discharge generation product (acidic gas) during a charging step is prevented.

Even when the proposed technologies, however, a relative large amount of the component oxidized and deteriorated is included inside the electrophotographic photoconductor, and therefore a fundamental improvement cannot be expected and high quality output cannot be maintained if the electrophotographic photoconductor is used over a long period.

The present disclosure can provide a photoelectric conversion device that includes a ceramic film disposed on a charge-transporting layer including an organic material or sensitizing dye electrode layer, has less variations in properties thereof against external stimuli, such as a temperature change, exposure to gas, and a humidity change, and is low cost and has high durability.

The proposal of PTL 1 disclosed in the background art includes a protective layer including ceramic as a p-type semiconductor, but the ceramic is not in the form of a film but a particulate semiconductor.

The proposals of PTLs 2 to 3 cannot achieve the object of the present disclosure because the proposed is not a structure where a metal oxide film or a compound semiconductor thin film is disposed on a layer including an organic material.

<Ceramic Film>

The ceramic film is a film formed of ceramic.

The ceramic is typically a metal compound obtained by firing a metal. The ceramic is not particularly limited and may be appropriately selected depending on the intended purpose. Examples of the ceramic include metal oxides, such as titanium oxide, silica, alumina, zirconium oxide, tin oxide, and indium oxide.

The ceramic is preferably a ceramic semiconductor.

The ceramic film is preferably a ceramic semiconductor film.

<<Ceramic Semiconductor>>

Among ceramics, the ceramic semiconductor is a ceramic whose typical electron configuration is partially defected due to oxygen deficiency, and is a collective name of compounds exhibiting conductivity under specific conditions due to the defect of the electron configuration.

The ceramic semiconductor film has characteristics that the ceramic semiconductor film exhibits conductivity under specific conditions, is a layer where a ceramic semiconductor component is densely disposed without any gap, and is a layer that does not include an organic compound. The ceramic semiconductor film preferably includes delafossite.

In the present disclosure, moreover, the ceramic semiconductor film preferably has mobility of charge that is either holes or electrons in view of application to a photoelectric conversion device.

Moreover, charge mobility of the ceramic semiconductor at the magnetic field strength of $2 \times 10^5$ V/cm is preferably $1 \times 10^{-6}$ cm$^2$/Vsec or greater. In the present disclosure, the higher charge mobility is better.

A measuring method of the charge mobility is not particularly limited and may be appropriately selected from general measuring methods according to the necessity. Examples of the measuring method include a method where production of a sample and a measurement are performed according to the method disclosed in Japanese Unexamined Patent Application Publication No. 2010-183072.

Moreover, bulk resistance of the ceramic semiconductor film including a thickness thereof is preferably less than $1 \times 10^{13}$ ohm.

—Delafossite—

The delafossite (may be referred to as a "p-type semiconductor" or "p-type metal compound semiconductor" hereinafter) is not particularly limited as long as the delafossite has a function as a p-type semiconductor and may be appropriately selected depending on the intended purpose. Examples of the delafossite include a p-type metal oxide semiconductor, a p-type compound semiconductor including monovalent copper, and other p-type metal compound semiconductors.

Examples of the p-type metal oxide semiconductor include CoO, NiO, FeO, Bi$_2$O$_3$, MoO$_2$, MoS$_2$, Cr$_2$O$_3$, SrCu$_2$O$_2$, and CaO—Al$_2$O$_3$.

Examples of the p-type compound semiconductor including monovalent copper include CuI, CuInSe$_2$, Cu$_2$O, CuSCN, CuS, CuInS$_2$, CuAlO, CuAlO$_2$, CuAlSe$_2$, CuGaO$_2$, CuGaS$_2$, and CuGaSe$_2$.

Examples of other p-type metal compound semiconductor include GaP, GaAs, Si, Ge, and SiC.

(Production of Ceramic Film)

A production method (film formation method) of the ceramic film is not particularly limited and may be appropriately selected from generally used film formation methods of inorganic materials depending on the intended purpose. Examples of the production method include a vapor deposition method, a liquid phase growth method, and a solid phase growth method.

For example, the vapor deposition method is classified into a physical vapor deposition (PVD) method and a chemical vapor deposition (CVD) method.

Examples of the physical vapor deposition method include vacuum vapor deposition, electron beam vapor deposition, laser abrasion, laser abrasion MBE, MOMBE, reactive vapor deposition, ion plating, a cluster ion beam method, glow discharge sputtering, ion beam sputtering, and reactive sputtering.

Examples of the chemical vapor deposition method include thermal CVD, MOCVD, RF plasma CVD, ECR plasma CVD, photo CVD, and laser CVD.

Examples of the liquid phase growth method include LPE, electroplating, electroless plating, and coating.

Examples of the solid phase growth method include SPE, a recrystallization method, graphoepitaxy, an LB method, a sol-gel method, and an aerosol deposition (AD) method.

Among the above-listed methods, an AD method is preferable because a uniform film is formed over a relatively large area region, such as an electrophotographic photoconductor or properties of the electrophotographic photoconductor are not affected by the production method.

—Aerosol Deposition (AD) Method—

The aerosol deposition (AD) method is a technology where particles or ultra-fine particles prepared in advance are mixed with gas to form an aerosol and the aerosol is ejected to a film formation target (substrate) to form a coating film.

As characteristics of the AD method, film formation can be performed in a room temperature environment and can be performed in a state where crystal structures of raw materials are almost maintained. Therefore, the AD method is suitable for film formation on a photoelectric conversion device (particularly, an electrophotographic photoconductor).

A method for forming a ceramic film according to the aerosol deposition method will be described.

For the method for forming the ceramic film, an aerosol deposition device as illustrated in FIG. 8 is used. In a gas cylinder 11 illustrated in FIG. 8, an inert gas for generating aerosol is stored. The gas cylinder 11 is linked with an aerosol generator 13 via a pipe 12a, and the pipe 12a is drawn into the aerosol generator 13. The aerosol generator 13 is charged with a certain amount of particles 20 formed of metal oxide or a compound semiconductor. Another pipe 12b linked with the aerosol generator 13 is connected to a jet nozzle 15 inside a film formation chamber 14.

Inside the film formation chamber 14, a substrate 16 is held with a substrate holder 17 in a manner that the substrate 16 faces a jet nozzle 15. As the substrate 16, an aluminium foil (positive electrode collector) is used. An exhaust pump 18 is connected to the film formation chamber 14 via a pipe 12c where the exhaust pump 18 is configured to adjust a degree of vacuum inside the film formation chamber 14.

Although it is not illustrated, a film formation device configured to form an electrode of the present embodiment includes a system that moves the substrate holder 17 in a cross direction (cross direction on a plane of the substrate holder 17 facing the jet nozzle 15 and moves the jet nozzle 15 in a longitudinal direction (longitudinal direction on a plane of the substrate holder 17 facing the jet nozzle 15) at constant speed. A ceramic film of a desired area can be formed on the substrate 16 by performing film formation with moving the substrate holder 17 in the cross direction and moving the jet nozzle 15 in the longitudinal direction.

In the process for forming the ceramic film, first, a compressed air valve 19 is closed, and the inner atmosphere from the film formation chamber 14 to the aerosol generator 13 is vacuumed by the exhaust pump 18. Gas inside the gas cylinder 11 is introduced to the aerosol generator 13 through the pipe 12a by opening the compressed air valve 19 to scatter particles 20 inside the container, to thereby generate aerosol in a state where the particles 20 are dispersed in the gas. The generated aerosol is ejected from the nozzle 15 towards the substrate 16 via 12b at high speed. After 0.5 seconds passes in the state where the compressed air valve 19 is open, the compressed air valve 19 is closed for the next 0.5 seconds. Thereafter, the compressed air valve 19 is opened again, and opening and closure of the compressed air valve 19 is repeated at interval of 0.5 seconds. A flow rate of the gas from the gas cylinder 11 is set to 2 L/min, the duration of the film formation is 7 hours, the degree of vacuum inside the film formation chamber 14 when the compressed air valve 19 is closed is about 10 Pa, and the degree of vacuum in the film formation chamber 14 when the compressed air valve 19 is open is about 100 Pa.

The jet speed of the aerosol is controlled by a shape of the nozzle 15, a length or inner diameter of the pipe 12b, the internal gas pressure of the gas cylinder 11, or an exhaust amount of the exhaust pump 18 (the internal pressure of the film formation chamber 14). When the internal pressure of the aerosol generator 13 is set to several ten thousands Pa, the internal pressure of the film formation chamber 14 is set to several hundreds Pa, and a shape of an opening of the nozzle 15 is a circle having an inner diameter of 1 mm, for example, the jet speed of the aerosol can be made several hundreds m/sec owing to the internal pressure difference between the aerosol generator 13 and the film formation chamber 14. A ceramic film having a void ratio of 5% or greater but 30% or less can be formed by maintaining the internal pressure of the film formation chamber 14 to 5 Pa or greater but 100 Pa or less and the internal pressure of the aerosol generator 13 to 50,000 Pa. An average thickness of the ceramic film is preferably adjusted to 0.1 micrometers or greater but 10 micrometers or less by adjusting the duration for supplying the aerosol under the above-described conditions.

The particles 20 in the aerosol where the speed of the movement of the particles is accelerated to obtain kinetic energy are bumped into the substrate 16 and are finely crushed by collision energy. Then, the crushed particles joined to the substrate 16 and the crushed particles are joined together to sequentially form a ceramic film on the charge-transporting layer.

The film formation is performed by forming a line pattern several times and rotation of a photoconductor drum. The drum holder 17 or the jet nozzle 15 is scanned in the longitudinal direction or cross direction on a surface of the substrate 16 (collector 23), to form a positive electrode active material layer 21 of a desired area. The method thereof is as follows. First, the substrate holder 17 is fixed in the longitudinal direction and is scanned along the cross direction at constant speed. Once scanning for one line is completed, the jet nozzle 15 is moved in the longitudinal direction considering overlap with the previous film formation area, and then the substrate holder 17 is scanned in the cross direction. As described above, the substrate holder 17 is moved in the longitudinal direction several times until the substrate holder 17 reaches a desired longitudinal direction position, and scanning in the cross direction is repeated. As a result, deposition of a desired film formation area can be performed.

(Electrophotographic Photoconductor)

One embodiment of the photoelectric conversion device of the present disclosure is an electrophotographic photoconductor.

The electrophotographic photoconductor (may be referred to as a "photoconductor" hereinafter) includes a conductive support serving as a support, a charge-transporting layer including an organic charge-transporting material, where the charge-transporting layer is disposed on the support, and a ceramic film disposed on the charge-transporting layer. The photoelectric conversion device further includes a charge-generating layer, and may further include other layers, such as an intermediate layer and a protective layer, according to the necessity.

For the ceramic film, any of the above-described matters can be appropriately applied.

Note that, a layer obtained by subsequently laminating a charge-generating layer and a charge-transporting layer may be referred to as a photoconductive layer.

An example where the photoelectric conversion device is an electrophotographic photoconductor will be described hereinafter, but the photoelectric conversion device is not limited to the electrophotographic photoconductor and may be applied for another photoelectric conversion devices.

A structure of a photoelectric conversion device 10A that is an electrophotographic photoconductor will be described based on FIG. 5. Note that, FIG. 5 is a cross-sectional view illustrating one example of the electrophotographic photoconductor.

One embodiment of the electrophotographic photoconductor is illustrated in FIG. 5. In the embodiment illustrated in FIG. 5, the electrophotographic photoconductor 10A includes an intermediate layer 2, a charge-generating layer 3, a charge-transporting layer 4, and a ceramic film 5 on a conductive support 1 in this order.

<Support (Conductive Support)>

The conductive support is not particularly limited and may be appropriately selected depending on the intended purpose, as long as the conductive support has conductivity exhibiting volume resistivity of $10^{10}$ ohm·cm or less. Examples of the conductive support include: a support obtained by covering a film or cylindrical plastic or paper with a metal (e.g., aluminium, nickel, chromium, nichrome, copper, silver, gold, platinum, and iron) or an oxide (e.g., tin oxide and indium oxide) by vapor deposition or sputtering; a plate of aluminium, an aluminium alloy, nickel, or stainless steel; and a tube obtained by forming the above-mentioned plate into a tube through a method, such as drawing ironing, impact ironing, extruded ironing, extruded drawing, or cutting, followed by performing a surface treatment, such as cutting, super-finishing, and polishing.

<Intermediate Layer>

The electrophotographic photoconductor may include an intermediate layer disposed between the conductive support and a photoconductive layer. The intermediate layer is disposed for the purpose of improving adhesion, preventing moire, improving coatability of an upper layer, and preventing charge injection from the conductive support.

Typically, the intermediate layer includes a resin as a main component. Since the photoconductive layer is coated on the intermediate layer, a resin used in the intermediate layer is preferably a thermosetting resin that is insoluble to an organic solvent. Among such thermosetting resins, polyurethane, a melamine resin, and an alkyd-melamine resin are more preferable because most of these resins sufficiently satisfy the above-described object.

Examples of the organic solvent include tetrahydrofuran, cyclohexanone, dioxane, dichloroethane, and butanone. The resin may be appropriately diluted with the organic solvent and the resultant may be used as a coating material.

Moreover, particles of metal or metal oxide may be added to the intermediate layer in order to control conductivity or prevent moire. The metal oxide is preferably titanium oxide or zinc oxide. A dispersion liquid is obtained by dispersing the particles in the organic solvent by means of a ball mill, an attritor, and a sand mill, the dispersion liquid and the resin component are mixed, and the resultant may be used as a coating material.

Examples of a production method (film formation method) of the intermediate layer include: a method where the coating material is applied onto a conductive support by dip coating, spray coating, bead coating etc., to form a film; and a method where the obtained film is optionally heated and cured. It is often a case that an average thickness of the intermediate layer is appropriate when the average thickness is about 2 micrometers or greater but about 20 micrometers or less. In the case where accumulation of residual potential of the photoconductor is large, the average thickness of the intermediate layer can be made less than 3 micrometers.

<Photoconductive Layer>

A photoconductive layer of the photoconductor is a laminate photoconductive layer where a charge-generating layer and a charge-transporting layer are sequentially laminated as a photoconductive layer.

<Charge-Generating Layer>

The charge-generating layer is part of the laminate photoconductive layer and has a function of generating charge through exposure. The charge-generating layer includes a charge-generating material as a main component and may further include a binder resin according to the necessity. Examples of the charge-generating material include an inorganic charge-generating material and an organic charge-generating material.

Examples of the inorganic charge-generating material include crystalline selenium, amorphous selenium, selenium-tellurium, selenium-tellurium-halogen, selenium-arsenic compound, and amorphous silicon. As amorphous silicon, amorphous silicon whose dangling bond is terminated with a hydrogen atom or a halogen atom, or amorphous silicon-doped with a boron atom or a phosphorus atom is preferably used.

As the organic charge-generating material, any of materials known in the art can be used. Examples of the organic charge-generating material include metal phthalocyanine (e.g., titanyl phthalocyanine and chlorogallium phthalocyanine), nonmetal phthalocyanine, an azlenium salt pigment, a squaric acid methine pigment, a symmetric or asymmetric azo pigment having a carbazole skeleton, a symmetric or asymmetric azo pigment having a triphenylamine skeleton, a symmetric or asymmetric azo pigment having a fluorenone skeleton, and a perylene-based pigment. Among the above-listed examples, metal phthalocyanine, a symmetric or asymmetric azo pigment having a fluorenone skeleton, a symmetric or asymmetric azo pigment having a triphenylamine skeleton, and a perylene-based pigment are preferable because all of the above-mentioned materials have high quantum efficiency of charge generation. The above-listed charge-generating materials may be used alone or in combination.

Examples of the binder resin include polyamide, polyurethane, an epoxy resin, polyketone, polycarbonate, polyarylate, a silicone resin, an acrylic resin, polyvinyl butyral, polyvinyl formal, polyvinyl ketone, polystyrene, poly-N-vinylcarbazole, and polyacryl amide.

Moreover, a polymer charge-transporting material described below may be also used. Among the above-listed examples, polyvinyl butyral is often used and is effective. The above-listed binder resins may be used alone or in combination.

(Production Method of Charge-Generating Layer)

Production methods of the charge-generating layer are roughly classified into a vacuum thin film formation method and a casting method from a solution dispersion system.

Examples of the vacuum thin film forming method include vacuum vapor deposition, glow discharge decomposition, ion plating, sputtering, reactive sputtering, and chemical vapor deposition (CVD). The vacuum thin film forming method is suitably used for production of a layer formed of the inorganic charge-generating material or the organic charge-generating material.

As a production method of a charge-generating layer through the casting, the above-mentioned inorganic charge-generating material or organic charge-generating material is dispersed in an organic solvent, optionally together with a binder resin by means of a ball mill, an attritor, or a sand mill to obtain a dispersion liquid, and the dispersion liquid is appropriately diluted and applied.

Examples of the organic solvent include tetrahydrofuran, cyclohexanone, dioxane, dichloroethane, and butanone. Among the above-listed examples, methyl ethyl ketone, tetrahydrofuran, and cyclohexanone are preferable because these solvents have a lower degree of environmental load compared to chlorobenzene, dichloromethane, toluene, and xylene.

The application of the dispersion liquid can be performed by dip coating, spray coating, or bead coating.

An average thickness of the charge-generating layer is preferably 0.01 micrometers or greater but 5 micrometers or less.

In the case where reduction of residual potential or increase in sensitivity is desired, the above-mentioned properties are often improved by increasing a film thickness of the charge-generating layer. On the other hand, the increased thickness of the charge-generating layer tends to cause deteriorations in charging properties, such as retention of charge or formation of space charge. In view of a balance between the above-mentioned advantages and disadvantages, an average thickness of the charge-generating layer is more preferably 0.05 micrometers or greater but 2 micrometers or less.

Moreover, a low molecular weight compound (e.g., an antioxidant, a plasticizer, a lubricant, and a UV absorber) and a leveling agent may be optionally added to the charge-generating layer. The above-listed compounds may be used alone or in combination. Use of the low molecular weight compound and the leveling agent in combination often causes deterioration in sensitivity. Therefore, an amount of the low molecular weight compound and the leveling agent for use is generally preferably 0.1 phr or greater but 20 phr or less, and more preferably 0.1 phr or greater but 10 phr or less. An amount of the leveling agent for use is preferably 0.001 phr or greater but 0.1 phr or less.

<Charge-Transporting Layer>

The charge-transporting layer is part of a laminate photoconductive layer and has a function of injecting and transporting charge generated in the charge-generating layer to neutralize the charge of a surface of the photoconductor generated by the charging. The charge-transporting layer includes, as main components, a charge-transporting material and a binder component configured to bind the charge-transporting material.

The charge-transporting layer includes at least an organic charge-transporting material as a charge-transporting material. The charge-transporting layer may further include a low molecular weight electron-transporting material and a hole-transporting material according to the necessity.

Examples of the low molecular weight electron-transporting material include an electron-accepting material, such as an asymmetric diphenoquinone derivative, a fluorene derivative, and a naphthalimide derivative. The above-listed electron-transporting material may be used alone or in combination.

As the hole-transporting material, an electron-donating material is preferably used. Examples of the hole-transporting material include an oxazole derivative, an oxadiazole derivative, an imidazole derivative, a triphenylamine derivative, a butadiene derivative, 9-(p-diethylaminostyrylanthracene), 1,1-bis-(4-dibenzylaminophenyl)propane, styrylanthracene, styrylpyrazoline, phenylhydrazones, an alpha-phenylstilbene derivative, a thiazole derivative, a triazole derivative, a phenazine derivative, an acridine derivative, a benzofuran derivative, a benzimidazole derivative, and a thiophene derivative. The above-listed hole-transporting materials may be used alone or in combination.

—Organic Charge-Transporting Material—

Examples of the organic charge-transporting material (may be referred to as a "polymeric charge-transporting material" hereinafter) include a polymer including a carbazole ring (e.g., poly-N-vinylcarbazole), a polymer having a hydrazone, a polysilylene polymer, and aromatic polycarbonate. The above-listed organic charge-transporting materials may be used alone or in combination.

The organic charge-transporting material is a material suitable for preventing a curing failure of a crosslinked surface layer because components constituting the organic charge-transporting material bleed out less on the crosslinked surface layer, compared to a low molecular weight charge-transporting material, when the crosslinked surface layer is disposed on the crosslinked surface layer. As a molecular weight of the charge-transporting material increases, heat resistance improves more. Therefore, deteriorations due to curing heat at the time of film formation of the crosslinked surface layer unlikely to occur and thus use of the organic charge-transporting material is advantageous.

Examples of the binder component include thermoplastic or thermosetting resins, such as polystyrene, polyester, polyvinyl, polyarylate, polycarbonate, an acrylic resin, a silicone resin, a fluororesin, an epoxy resin, a melamine resin, a urethane resin, a phenol resin, and an alkyd resin. Among the above-listed examples, polystyrene, polyester, polyarylate, and polycarbonate are effective because most of the above-listed compounds exhibit excellent charge-transporting properties when the above-listed compounds are used as a binder component of a charge-transporting component. Since the crosslinked surface layer is preferably disposed on the charge-transporting layer, moreover, the charge-transporting layer does not need to provide mechanical strength, unlike a charge-transporting layer known in the art. Therefore, a material relatively low mechanical strength but high transparency, such as polystyrene, which is determined as inapplicable in the related art, can be effectively used as a binder component of the charge-transporting layer.

The binder component may be used alone or in combination, or as a copolymer formed of two or more starting material monomers thereof, or as a copolymer with a charge-transporting material.

When an electrically inert polymer compound is used for improving the charge-transporting layer, cardo polymer-type polyester having a bulky skeleton, such as fluorene, polyester, such as polyethylene terephthalate and polyethylene naphthalate, polycarbonate, in which 3,3' site of a phenol component of bisphenol polycarbonate, such as C-type polycarbonate, is substituted with an alkyl group, polycarbonate, in which a germinal methyl group of bisphenol A is substituted with a long-chain alkyl group having 2 or more carbon atoms, polycarbonate having a biphenyl or biphenyl ether skeleton, polycaprolactone, polycarbonate including a long-chain alkyl skeleton, such as polycaprolactone (disclosed, for example, in Japanese Unexamined Patent Application Publication No. 07-292095), an acrylic resin, polystyrene, or hydrogenated butadiene is effective.

The electrically inert polymer compound means a polymer compound free from chemical structure exhibiting photoconductivity, such as a triaryl amine structure. When the electrically inert polymer compound is used as an additive in combination with a binder resin, an amount thereof is preferably 50% by mass or less relative to a total solid content of the charge-transporting layer in view of limitation of light attenuation sensitivity.

When the low molecular weight charge-transporting material is used, an amount thereof is typically, preferably 40 phr or greater but 200 phr or less, and more preferably 70 phr or greater but 100 phr or less. When the polymeric charge-transporting material is used, preferably used is a material obtained by copolymerizing a charge-transporting component and a resin component at an approximate ratio that an amount of the resin component is 0 parts by mass or greater but 200 parts by mass or less, preferably 80 parts by mass or greater but 150 parts by mass or less relative to 100 parts by mass of the charge-transporting component.

In view of satisfying high sensitivity, an amount of the charge-transporting material is preferably 70 phr or greater. Moreover, polymeric charge-transporting materials each having a monomer, dimer, or a structure of an alpha-phenylstilbene compound, a benzidine compound, or a butadiene compound in a main chain or side chain thereof are often materials having high charge mobility and are effective as the charge-transporting material.

The charge-transporting layer can be formed by dissolving or dispersing, in an appropriate solvent, a mixture or copolymer including a charge-transporting component and a binder component as main components to prepare a charge-transporting layer coating material, and applying and drying the coating material. As the application method, dipping, spray coating, ring coating, a roll coater method, gravure coating, nozzle coating, or screen coating is applied.

Examples of the dispersing solvent that can be used for preparing the charge-transporting layer coating material include: ketones, such as methyl ethyl ketone, acetone, methyl isobutyl ketone, and cyclohexanone; ethers, such as dioxane, tetrahydrofuran, and ethylcellosolve; aromatics, such as toluene and xylene; halogens, such as chlorobenzene, and dichloromethane; and esters, such as ethyl acetate, and butyl acetate. Among the above-listed examples, methyl ethyl ketone, tetrahydrofuran, and cyclohexanone are preferable because methyl ethyl ketone, tetrahydrofuran, and cyclohexanone have the lower degree of environmental load compared to chlorobenzene, dichloromethane, toluene, and xylene. The above-listed solvents may be used alone or in combination.

Since a crosslinked surface layer is typically disposed above the charge-transporting layer, an average thickness of the charge-transporting layer in such a structure does not need to be made thick considering potential film abrasion on practical use. In order to secure necessary sensitivity and charging ability on practice, the average thickness of the charge-transporting layer is preferably 10 micrometers or greater but 40 micrometers or less, and more preferably 15 micrometers or greater but 30 micrometers or less.

Moreover, a low molecular weight compound (e.g., an antioxidant, a plasticizer, a lubricant, and an UV absorber) and a leveling agent may be optionally added to the charge-transporting layer. The above-listed compounds may be used alone or in combination. Use of the low molecular weight compound and the leveling agent in combination often cause deterioration in sensitivity. Therefore, an amount of the low molecular weight compound and the leveling agent for use is generally preferably 0.1 phr or greater but 20 phr or less and more preferably 0.1 phr or greater but 10 phr or less, and an amount of the leveling agent for use is appropriately about 0.001 phr or greater but about 0.1 phr or less.

<Ceramic Film>

As a ceramic film in the electrophotographic photoconductor and a production method thereof, the matters described related to the ceramic film of the photoelectric conversion device of the present disclosure and the production method thereof are appropriable selected and applied.

<Protective Layer (Surface Layer)>

A protective layer (surface layer) other than the ceramic film is not particularly limited and may be appropriately selected from protective films (surface layers) known in the art.

(Image Forming Apparatus)

An image forming apparatus of the present disclosure includes the electrophotographic photoconductor (photoelectric conversion device) and further includes an electrostatic latent image forming unit and a developing unit. The image forming apparatus may further include other units according to the necessity.

An image forming method associated with the present disclosure includes at least an electrostatic latent image forming step and a developing step. The image forming method may further include other steps according to the necessity.

The image forming method is suitably performed by the image forming apparatus. The electrostatic latent image forming step is suitably performed by the electrostatic latent image forming unit. The developing step is suitably performed by the developing unit. The above-mentioned other steps are suitably performed by the above-mentioned other units.

<Electrostatic Latent Image Forming Unit and Electrostatic Latent Image Forming Step>

The electrostatic latent image forming unit is not particularly limited and may be appropriately selected depending on the intended purpose, as long as the electrostatic latent image forming unit is a unit configured to form an electrostatic latent image on the electrostatic latent image bearer. Examples of the electrostatic latent image forming unit include a unit including at least a charging member configured to charge a surface of the electrostatic latent image bearer and an exposing unit configured to expose the surface of the electrostatic latent image bearer to light imagewise.

The electrostatic latent image forming step is not particularly limited and may be appropriately selected depending on the intended purpose, as long as the electrostatic latent image forming step is a step including forming an electrostatic latent image on the electrostatic latent image bearer. For example, the electrostatic latent image forming step can be performed by charging a surface of the electrostatic latent image bearer, followed by performing imagewise exposure, and can be performed by the electrostatic latent image forming unit.

<<Charging Member and Charging>>

The charging member is not particularly limited and may be appropriately selected depending on the intended purpose. Examples of the charging member include a contact charger, known in the art as itself, equipped with a conductive or semiconductive roller, brush, film, or rubber blade, and a non-contact charger utilizing corona discharge, such as corotron and scorotron.

For example, the charging can be performed by applying voltage to a surface of the electrostatic latent image bearer using the charging member.

<<Exposing Member and Exposing>>

The exposing member is not particularly limited and may be appropriately selected depending on the intended purpose, as long as the exposing member is capable of exposing the surface of the electrostatic latent image bearer charged by the charging member to light imagewise. Examples of the exposing member include various exposing members, such as reproduction optical exposure unit, a rod-lens array exposure unit, a laser optical exposure unit, and a liquid crystal shutter optical unit.

For example, the exposing can be performed by exposing a surface of the electrostatic latent image bearer to light imagewise using the exposing member.

Note that, in the present disclosure, a back light system where exposing is performed imagewise from a back side of the electrostatic latent image bearer may be employed.

<Developing Unit and Developing Step>

The developing unit is not particularly limited and may be appropriately selected depending on the intended purpose, as long as the developing unit is a developing unit that stores therein a toner and is configured to develop the electrostatic latent image on the electrostatic latent image bearer with the toner to form a visible image.

The developing step is not particularly limited and may be appropriately selected depending on the intended purpose, as long as the developing step is a step including developing the electrostatic latent image formed on the electrostatic latent image bearer with a toner to form a visible image. For example, the developing step can be performed by the developing unit.

The developing unit may be of a dry developing system or of a wet developing system. Moreover, the developing unit may be a developing unit for a single color or a developing unit for multiple colors.

The developing unit is preferably a developing device including a stirrer configured to stir the toner to charge the toner through friction, and a rotatable developer bearer that includes a magnetic field generating unit fixed therein and is capable of bearing a developer including the toner on a surface of thereof.

<Other Units and Other Steps>

Examples of the above-mentioned other units include a transferring unit, a fixing unit, a cleaning unit, a charge-eliminating unit, a recycling unit, and a controlling unit.

Examples of the above-mentioned other steps include a transferring step, a fixing step, a cleaning step, a charge-eliminating step, a recycling step, and a controlling step.

Next, one embodiment for performing a method for forming an image using the image forming apparatus of the present disclosure will be described with reference to FIG. 1. An image forming apparatus 100A illustrated in FIG. 1 includes a photoconductor drum 10 serving as an electrostatic latent image bearer, a charging roller 20 serving as a charging unit, an exposing device (not illustrated) serving as an exposing unit, developing devices 45 (K, Y, M, and C) serving as developing units, an intermediate transfer member 50, a cleaning device 6 having a cleaning blade serving as a cleaning unit, and a charge-eliminating lamp 70 serving as a charge-eliminating unit. The intermediate transfer member 50 is an endless belt. The intermediate transfer member 50 is supported by 3 rollers 51 disposed inside the intermediate transfer member 50 and can move in the direction indicated with the arrow. Part of the 3 rollers 51 also functions as a transfer bias roller capable of applying the predetermined transfer bias (primary transfer bias) to the intermediate transfer member 50. Moreover, a cleaning device 90 having a cleaning blade is disposed near the intermediate transfer member 50. As a transferring unit configured to apply transfer bias for transferring (secondary transfer) a toner image to recording paper 95, moreover, a transfer roller 80 is disposed to face the intermediate transfer member 50.

In the surrounding area of the intermediate transfer member 50, a corona charger 52 configured to apply charge to a toner image on the intermediate transfer member 50 is disposed between a contact area between the photoconductor drum 10 and the intermediate transfer member 50, and a contact area between the intermediate transfer member 50 and recording paper 95.

The developing device 45 of each of black (K), yellow (Y), magenta (M), and cyan (C) includes a developer storage unit 42 (K, Y, M, or C), a developer supply roller 43, and a developing roller 44.

In the image forming apparatus 100A, after uniformly charging the photoconductor drum 10 by the charging roller 20, the photoconductor drum 10 is exposed to exposure light L imagewise by an exposing device (not illustrated) to form an electrostatic latent image. Next, a developer is supplied to the electrostatic latent image formed on the photoconductor drum 10 from the developing device 45 to develop and form a toner image. Thereafter, the toner image is transferred (primary transferred) to the intermediate transfer member 50 by transfer bias applied by the roller 51. After applying charge to the toner image on the intermediate transfer member 50 by the corona charger 52, the toner image is transferred (secondary transferred) to recording paper 95. Note that, the toner remained on the photoconductor drum 10 is removed by the cleaning device 6. The charge of the photoconductor drum 10 is eliminated by the charge-eliminating lamp 70.

Another example of the image forming apparatus of the present disclosure is illustrated in FIG. 2. The image forming apparatus 100B is a tandem color image forming apparatus, and a copier main body 150, a paper feeding table 200, a scanner 300, and an automatic document feeder (ADF) 400.

In a central area of the copier main body 150, an endless belt-type intermediate transfer member 50 is disposed. The intermediate transfer member 50 is supported by supporting rollers 14, 15, and 16, and is rotatable in the direction indicated with the arrow.

A cleaning device 17 configured to remove a toner remained on the intermediate transfer member 50 is disposed near the supporting roller 15. Moreover, a tandem developing device 120, in which four image forming units 18 of yellow, cyan, magenta, and black are aligned in series along the traveling direction of the intermediate transfer member 50, is disposed near the intermediate transfer member 50 supported by the supporting roller 14 and the supporting roller 15.

As illustrated in FIG. 3, the image forming unit 18 of each color includes a photoconductor drum 10, a charging roller 60 configured to uniformly charge the photoconductor drum 10, a developing device 61 configured to develop the electrostatic latent image formed on the photoconductor drum 10 with a developer of each of black (K), yellow (Y), magenta (M), and cyan (C) to form a toner image, a transfer roller 62 configured to transfer the toner image of each color to the intermediate transfer member 50, a photoconductor cleaning device 63, and a charge-eliminating lamp 64. In FIG. 3, the reference sign L represents laser light.

In the image forming apparatus of FIG. 2, moreover, an exposing device (not illustrated) is disposed near the tandem developing device 120. The exposing device is configured to expose the photoconductor drum 10 to exposure light to form an electrostatic latent image.

Moreover, a secondary transferring device 22 is disposed to the side of the intermediate transfer member 50 opposite to the side where the tandem developing device 120 is disposed. The secondary transferring device 22 includes a secondary transfer belt 24 that is an endless belt supported by a pair of rollers 23 and is designed in a manner that recording paper transported on the secondary transfer belt 24 and the intermediate transfer member 50 can be in contact with each other.

A fixing device 25 is disposed near the secondary transferring device 22. The fixing device 25 includes a fixing belt 26 that is an endless belt, and a press roller 27 disposed in a manner that the press roller is pressed against the fixing belt 26.

Moreover, a reverser 28 configured to reverse the recording paper to form images on both sides of the recording paper is disposed bear the secondary transferring device 22 and the fixing device 25.

Next, formation of a full-color image (color copy) performed in the image forming apparatus 100B will be described. First, a document is set on a document table 130 of an automatic document feeder (ADF) 400. Alternatively, the automatic document feeder 400 is open, a document is set on a contact glass 32 of a scanner 300, and then the automatic document feeder 400 is closed. In the case where the document is set on the automatic document feeder 400, once a start switch (not illustrated) is pressed, the document is transported onto the contact glass 32, and then the scanner 300 is driven to scan a first carriage 33 and a second carriage 34. In the case where the document is set on the contact glass 32, the scanner 300 is immediately driven to scan the first carriage 33 and the second carriage 34. During the scanning operation, light applied from a light source of the first carriage 33 is reflected by the surface of the document, the reflected light from the surface of the document is reflected by a mirror of the second carriage 34, and then the reflected light is received by a reading sensor 36 via an imaging forming lens 35. As a result, the color document (color image) is read and image information of each color of black, yellow, magenta, and cyan is obtained.

After forming electrostatic latent images of the above-mentioned colors are formed on the photoconductor drum 10 based on the obtained image information of each of the colors, the electrostatic latent image of each color is developed by a developer supplied from the developing device of each color, to thereby form a toner image of each color. The formed toner images of the above-mentioned colors are sequentially transferred (primary transferred) and overlapped on the intermediate transfer member 50 rotatably driven by the supporting rollers 14, 15, and 16, to thereby form a composite toner image on the intermediate transfer member 50.

In the paper feeding table 200, one of the paper feeding rollers 142 is selectively rotated to eject recording paper from one of multiple paper feeding cassettes 144 of the paper bank 143, the ejected sheets of the recording paper are separated one by one by a separation roller 145 to send each sheet of the recording paper to a paper feeding path 146, and then transported by a transport roller 147 into a paper feeding path 148 within the copier main body 150. The recording paper transported in the paper feeding path 148 is then bumped against a registration roller 49 to stop. Alternatively, sheets of the recording paper on the manual paper feeding tray 54 are ejected and separated one by one by a separation roller 58 to guide into a manual paper feeding path 53, and then bumped against the registration roller 49 to stop. Note that, the registration roller 49 is generally earthed at the time of use, but bias may be applied at the time of use in order to remove paper dusts of the recording paper.

Then, the registration roller 49 is rotated synchronously with the movement of the composite toner image formed on the intermediate transfer member 50 to send the recording paper between the intermediate transfer member 50 and the secondary transfer device 22 to thereby transfer (secondary transfer) the composite toner image on the recording paper.

The recording paper to which the composite toner image has been transferred is transported by the secondary transferring device 22 to send the recording paper to the fixing device 25. Then, the composite toner image is heated and pressed by the fixing belt 26 and the press roller 27 in the fixing device 25 to fix the composite toner image on the recording paper. Thereafter, the traveling path of the recording paper is switched by a switch craw 55 and is ejected and stacked onto a paper ejection tray 57 by an ejection roller 56. Alternatively, the traveling path of the recording paper is switched by the switch craw 55, and the recording paper is reversed by the reverser 28 to send the recording paper to the transfer position again. After forming an image on the back surface of the recording paper, the recording paper is ejected by the ejection roller 56 and stacked on the paper ejection tray 57.

Note that, the toner remained on the intermediate transfer member 50 after transferring the composite toner image is removed by the cleaning device 17.

(Process Cartridge)

A process cartridge of the present disclosure includes the electrophotographic photoconductor (photoelectric conversion device), and further includes a developing unit configured to develop an electrostatic latent image on an electrophotographic photoconductor with a toner to form a toner image. The process cartridge may further include other units according to the necessity.

The process cartridge is constructed in a manner that the process cartridge is detachably mounted in various image forming apparatuses.

The developing unit includes a toner stored unit configured to store thereon the toner, and a toner bearer configured to bear and transport the toner stored in the toner stored unit. Note that, the developing unit may further include a regulator member configured to regulate a thickness of the toner born on the toner bearer.

One example of the process cartridge associated with the present disclosure is illustrated in FIG. 4. The process cartridge 110 includes a photoconductor drum 10, a corona charger 52, a developing device 40, a transfer roller 80, and a cleaning device 90. The reference sign 95 in FIG. 4 represents recording paper.

(Solar Battery Cell)

One embodiment of the photoelectric conversion device of the present disclosure is a solar battery cell.

The solar battery cell includes a support, a sensitizing dye electrode layer including an organic sensitizing dye, and a ceramic film on the sensitizing dye electrode layer. The solar battery cell further includes a first electrode, a hole-blocking layer, and a second electrode. The solar battery cell may further other members according to the necessity.

An example where the photoelectric conversion device is the solar battery cell hereinafter. However, the photoelectric conversion device is not limited to a solar battery cell and can also applied for other photoelectric conversion devices.

The solar battery cell (photoelectric conversion device) according to the present disclosure will be described with reference to drawings hereinafter. Note that, the present disclosure is not limited to embodiments described below and may be changed, such as other embodiments, addition, modification, and deletion, within a range a person skilled in the art can achieve. Any embodiment is included in the scope of the present disclosure as long as the embodiment exhibits a function and effect of the present disclosure.

The solar battery cell (photoelectric conversion device) includes a substrate serving as a support, a first electrode, a hole-blocking layer, an electron-transporting layer, a sensitizing dye electrode layer, a ceramic semiconductor film serving as a ceramic film, and a second electrode.

A structure of a photoelectric conversion device 10B that is a solar battery cell will be described based on FIG. 6. Note that, FIG. 6 is a cross-sectional view illustrating one example of the solar battery cell.

The embodiment illustrated in FIG. 6 depicts a structure where a first electrode 2 is formed on a substrate 1 serving as a support, a hole-blocking layer 3 is formed on the first electrode 2, an electron-transporting layer 4 is formed on the hole-blocking layer 3, a light sensitizing material 5 is adsorbed on an electron-transporting material of the electron-transporting layer 4, and a ceramic semiconductor 6 is sandwiched between the first electrode 2 and a second electrode 7 facing the first electrode 2. Moreover, FIG. 6 illustrates a structure where lead lines 8 and 9 are disposed in a manner that the first electrode 2 and the second electrode 7 are electrically conductive.

The details thereof will be described hereinafter.

<Support (Substrate)>

The substrate 1 as the support is not particularly limited and any of substrates known in the art can be used. The substrate 1 is preferably a substrate formed of a transparent material. Examples of the substrate include glass, a transparent plastic plate, a transparent plastic film, and an inorganic transparent crystal.

<First Electrode>

The first electrode 2 is not particularly limited as long as the first electrode 2 is formed of a conductive material transparent to visible light. As the first electrode 2, any of known electrodes typically used for photoelectric conversion elements or liquid crystal panels can be used.

Examples of a material of the first electrode include indium-tin oxide (referred to as ITO hereinafter), fluorine-doped tin oxide (referred to as FTO hereinafter), antimony-doped tin oxide (referred to as ATO hereinafter), indium-zinc oxide, niobium-titanium oxide, and graphene. The above-listed examples may be used alone, or two or more of the examples may be used in combination as a laminate.

An average thickness of the first electrode is preferably 5 nm or greater but 10 micrometers or less, and more preferably 50 nm or greater but 1 micrometer or less.

Moreover, the first electrode is preferably disposed on the substrate 1 formed of a material transparent to visible light in order to maintain certain hardness. As the substrate, for example, glass, a transparent plastic plate, a transparent plastic film, or an inorganic transparent crystal may be used.

A known product where the first electrode and the substrate are integrated may be used. Examples thereof include FTO-coated glass, ITO-coated glass, zinc oxide:aluminium-coated glass, an FTO-coated transparent plastic film, and an ITO-coated transparent plastic film.

Moreover, the integrated product may be a product where a transparent electrode formed by doping tin oxide or indium oxide with cationic ions or anionic ions having different atomic value, or a metal electrode having a structure that can pass through light, such as a mesh and stripes, is disposed on a substrate, such as a glass substrate. The above-listed examples may be used alone, or in combination, or in the state of a laminate.

In order to reduce resistance, moreover, a metal lead wire may be used in combination.

Examples of a material of the metal lead wire include metals, such as aluminium, copper, silver, gold, platinum, and nickel. The metal lead wire is formed by disposing the metal lead wire on the substrate through vapor deposition, sputtering, or crimping, followed by disposing ITO or FTO.

<Hole-Blocking Layer>

A material for constituting the hole-blocking layer 3 is not particularly limited as long as the material is transparent to visible light and is an electron-transporting material. The material is particularly preferably titanium oxide.

The hole-blocking layer is disposed for the purpose of preventing reduction in electric power due to recombination (so-called reverse electron transfer) of holes in an electrolyte and electrons on a surface of the electrode as the electrolyte is in contact with the electrode. The effect of the hole-blocking layer 3 is particularly significant in a solid dye-sensitized solar battery cell. This is because the speed of recombination (reverse electron transfer) of holes in a hole-transporting material and electrons on a surface of an electrode in a solid dye-sensitized solar battery cell using the organic hole-transporting material is fast compared to a wet dye-sensitized solar battery cell using an electrolyte.

A film formation method of the hole-blocking layer is not limited. In order to suppress current loss with indoor light, high internal resistance is necessary and therefore the film formation method is important. Typical examples thereof include a sol-gel method that is a wet film formation method. According to the sol-gel method, a resulting film density is low and therefore current loss may not be sufficiently prevented. Therefore, a dry film formation method, such as sputtering, is more preferable. According to the dry film formation method, a resultant film density is sufficiently high and therefore current loss can be prevented.

The hole-blocking layer is formed for the purpose of preventing electronic contact between the first electrode 2 and the hole-transporting layer 6. An average thickness of the hole-blocking layer is not particularly limited. The average thickness thereof is preferably 5 nm or greater but 1 micrometer or less. In case of wet film formation, the average thickness thereof is more preferably 500 nm or greater but 700 nm or less. In case of dry film formation, the average thickness thereof is more preferably 10 nm or greater but 30 nm or less.

<Electron-Transporting Layer>

The solar battery cell includes a porous electron-transporting layer 4 formed on the hole-blocking layer 3, where the electron-transporting layer may be a single layer or multiple layers.

The electron-transporting layer is formed of an electron-transporting material. As the electron-transporting material, semiconductor particles are particularly used.

In case of the multiple layers, dispersion liquids each including semiconductor particles having mutually different particle diameters may be applied to form multiple layers, or coated layers each including different types of semiconductor or having different compositions of a resin or additives may be disposed to form multiple layers. Multiple layer coating is an effective method when an average thickness is insufficient with one coating.

A trapping rate of light is high because an amount of a bearing photosensitizing material per unit projected area generally increases as an average thickness of the electron-transporting layer increases. However, a diffusion length of injected electrons increases and thus loss is large due to recombination of charge. Accordingly, an average thickness of the electron-transporting layer is preferably 100 nm or greater but 100 micrometers or less.

The semiconductor is not particularly limited and any of semiconductors known in the art can be used. Specific examples of the semiconductor include single semiconductors (e.g., silicon and germanium), compound semiconductors (e.g., chalcogenides of metals), and compounds having the Perovskite structure.

Examples of the chalcogenides of metals include: oxides of titanium, tin, zinc, iron, tungsten, zirconium, hafnium, strontium, indium, cerium, yttrium, lanthanum, vanadium, niobium, or tantalum; sulfides of cadmium, zinc, lead, silver, antimony, or bismuth; selenides of cadmium or lead; and telluride of cadmium.

Examples of other compound semiconductors include: phosphides of zinc, gallium, indium, cadmium, etc.; gallium arsenide; copper-indium-selenide; and copper-indium-sulfide.

Moreover, the compounds having the Perovskite structure are preferably strontium titanate, calcium titanate, sodium titanate, barium titanate, and potassium niobate.

Among the above-listed examples, an oxide semiconductor is preferable, and titanium oxide, zinc oxide, tin oxide, and niobium oxide are preferable. The above-listed examples may be used alone or in combination. A crystal type of the above-mentioned semiconductor is not particularly limited, and the crystal type may be monocrystalline, polycrystalline, or amorphous.

An average particle diameter of primary particles of the semiconductor particles is not particularly limited. The average particle diameter is preferably 1 nm or greater but 100 nm or less, and more preferably 5 nm or greater but 50 nm or less.

Moreover, an efficiency may be improved with an effect of scattering incident light by mixing or laminating semiconductor particles having an average particle diameter larger than the above-mentioned average particle diameter. In this case, an average particle diameter of the semiconductor particles is preferably 50 nm or greater but 500 nm or less.

A production method of the electron-transporting layer is not particularly limited. Examples of the production method thereof include: a method where a thin film is formed in vacuum, such as sputtering; and a wet film-forming method.

In view of production cost, a wet film formation method is particularly preferable, and a method where a paste in which semiconductor particles or a sol is dispersed is prepared and the paste is applied onto an electron collector electrode substrate is preferable.

When the wet film formation method is used, a coating method is not particularly limited and may be appropriately selected depending on the intended purpose. Examples of the coating method include dip coating, spray coating, wire-bar coating, spin coating, roller coating, blade coating, and gravure coating. As a wet printing method, moreover, various methods, such as relief printing, offset printing, gravure printing, intaglio printing, rubber plate printing, and screen printing, may be used.

In the case where a dispersion liquid of the semiconductor particles is produced by mechanical pulverization or using a mill, the dispersion liquid is formed by dispersing at least semiconductor particles alone or a mixture of semiconductor particles and a resin, in water or an organic solvent. Examples of the resin for use include polymer or copolymer of a vinyl compound (e.g., styrene, vinyl acetate, acrylic acid ester, and methacrylic acid ester), a silicone resin, a phenoxy resin, a polysulfone resin, a polyvinyl butyral resin, a polyvinyl formal resin, a polyester resin, a cellulose ester resin, a cellulose ether resin, a urethane resin, a phenol resin, an epoxy resin, a polycarbonate resin, a polyarylate resin, a polyamide resin, and a polyimide resin.

Examples of the solvent in which the semiconductor particles are dispersed include water, alcohol-based solvents (e.g., methanol, ethanol, isopropyl alcohol, and alpha-terpineol), ketone-based solvents (e.g., acetone, methyl ethyl ketone, and methyl isobutyl ketone), ester-based solvents (e.g., ethyl formate, ethyl acetate, and n-butyl acetate), ether-based solvents (e.g., diethyl ether, dimethoxy ethane, tetrahydrofuran, dioxolane, and dioxane), amide-based solvents (e.g., N,N-dimethylformamide, N,N-dimethylacetoamide, N-methyl-2-pyrrolidone), halogenated hydrocarbon solvents (e.g., dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene), and hydrocarbon-based solvent (e.g., n-pentane, n-hexane, n-octane, 1,5-hexadiene, cyclohexane, methylcyclohexane, cyclohexadiene, benzene, toluene, o-xylene, m-xylene, p-xylene, ethyl benzene, and cumene). The above-listed examples may be used alone or in combination as a mixed solvent.

To a dispersion liquid of the semiconductor particles or a paste of the semiconductor particles obtained by a sol-gel method etc., acid (e.g., hydrochloric acid, nitric acid, and acetic acid), a surfactant (e.g., polyoxyethylene(10) octylphenyl ether), or a chelating agent (e.g., acetyl acetone, 2-aminoethanol, and ethylene diamine) may be added in order to prevent re-aggregation of the particles.

Moreover, addition of a thickening agent is also effective for improving film formability. Examples of the thickening agent to be added include a polymer (e.g., polyethylene glycol and polyvinyl alcohol) and a thickening agent (e.g., ethyl cellulose).

After applying the semiconductor particles, particles are electronically contacted with one another, and firing, microwave irradiation, electron beam irradiation, or laser light irradiation is preferably performed in order to improve film strength or adhesion with a substrate. The above-listed treatments may be performed alone or in combination.

In the case where firing is performed, a range of a firing temperature is not particularly limited. Since the temperature is too high, resistance of a substrate becomes too high or the substrate may be melted. Therefore, the firing temperature is preferably 30 degrees Celsius or higher but 700 degrees Celsius or lower, and more preferably 100 degrees Celsius or higher but 600 degrees Celsius or lower. Moreover, a firing duration is not particularly limited. The firing duration is preferably 10 minutes or longer but 10 hours or shorter.

The microwave irradiation may be performed by applying microwaves from the side where an electron-transporting layer is formed, or from the back side. An irradiation duration is not particularly limited. The microwave irradiation is preferably performed within 1 hour.

After firing, for example, chemical plating using a mixed solution of an aqueous solution of titanium tetrachloride and an organic solvent, or electrochemical plating using a titanium trichloride aqueous solution may be performed for the purpose of increasing a surface area of semiconductor particles, or enhancing electron injection efficiency from a photosensitizing material to the semiconductor particles.

A film accumulated by firing the semiconductor particles each having a diameter of several tens nanometers forms a porous state. Such a nano porous structure has an extremely high surface area, and the surface area can be represented by a roughness factor.

The roughness factor is a numerical value indicating an actual area inside pores relative to an area of semiconductor particles applied onto a substrate. Therefore, the larger roughness factor is more preferable. The roughness factor is related to an average thickness of the electron-transporting layer. In the present disclosure, the roughness factor is preferably 20 or greater.

<Sensitizing Dye Electrode Layer>

The solar battery cell includes a sensitizing dye electrode layer formed by making an organic sensitizing dye (photosensitizing material) adsorbed on a surface of an electron-transporting material that is an electron-transporting layer 4.

—Organic Sensitizing Dye (Photosensitizing Material)—

A photosensitizing material 5 as the organic sensitizing dye is not limited to the above as long as the photosensitizing material is a compound that is photoexcited by excitation light. Specific examples of the photosensitizing material include the following compounds.

Examples thereof include: metal complex compounds disclosed in Japanese Examined Patent Application Publication No. 07-500630 and Japanese Unexamined Patent Application Publication Nos. 10-233238, 2000-26487, 2000-323191, and 2001-59062; coumarin compounds disclosed in Japanese Unexamined Patent Application Publication Nos. 10-93118, 2002-164089, and 2004-95450, and J. Phys. Chem. C, 7224, Vol. 111 (2007); polyene compounds disclosed in Japanese Unexamined Patent Application Publication No. 2004-95450 and Chem. Commun., 4887 (2007); indoline compounds disclosed in Japanese Unexamined Patent Application Nos. 2003-264010, 2004-63274, 2004-115636, 2004-200068, and 2004-235052, J. Am. Chem. Soc., 12218, Vol. 126 (2004), Chem. Commun., 3036 (2003), and Angew. Chem. Int. Ed., 1923, Vol. 47 (2008); thiophene compounds disclosed in J. Am. Chem. Soc., 16701, Vol. 128 (2006), and J. Am. Chem. Soc., 14256, Vol. 128 (2006); cyanine dyes disclosed in Japanese Unexamined Patent Application Publication Nos. 11-86916, 11-214730, 2000-106224, 2001-76773, and 2003-7359; merocyanine dyes disclosed in Japanese Unexamined Patent Application Publication Nos. 11-214731, 11-238905, 2001-52766, 2001-76775, and 2003-7360; 9-arylxanthene compounds disclosed in Japanese Unexamined Patent Application Publication Nos. 10-92477, 11-273754, 11-273755, and 2003-31273; triaryl methane compounds disclosed in Japanese Unexamined Patent Application Publication Nos. 10-93118 and 2003-31273; phthalocyanine compounds disclosed in Japanese Unexamined Patent Application Publication Nos. 09-199744, 10-233238, 11-204821, and 11-265738, J. Phys. Chem., 2342, Vol. 91 (1987), J. Phys. Chem. B, 6272, Vol. 97 (1993), Electroanal. Chem., 31, Vol. 537 (2002), Japanese Unexamined Patent Application Publication No. 2006-032260, J. Porphyrins Phthalocyanines, 230, Vol. 3 (1999), and Angew. Chem. Int. Ed., 373, Vol. 46 (2007), Langmuir, 5436, Vol. 24 (2008); and porphyrin compound. Among the above-listed examples, metal complex compounds, coumarin compounds, polyene compounds, indoline compounds, and thiophene compounds are particularly preferably used.

More preferable examples thereof include a compound represented by Structural Formula (3) below, a compound represented by Structural Formula (4) below, and a compound represented by Structural Formula (5) below, all available from MITSUBISHI PAPER MILLS LIMITED.

[Chem.1]

Structural Formula (3)

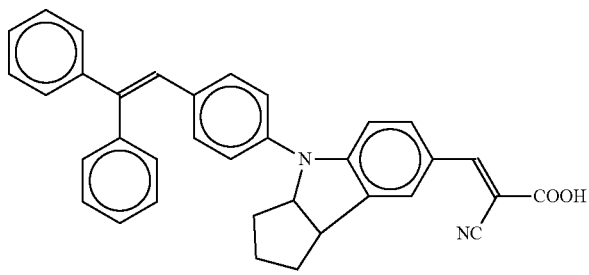

Structural Formula (4)

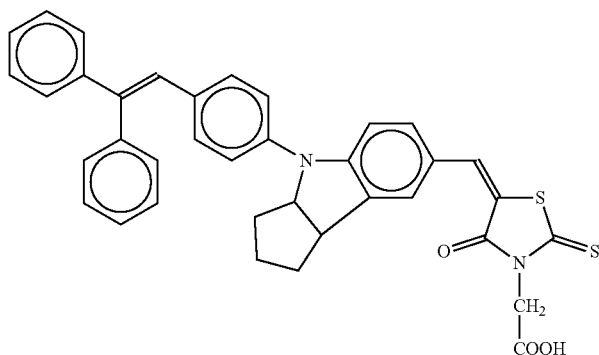

Structural Formula (5)

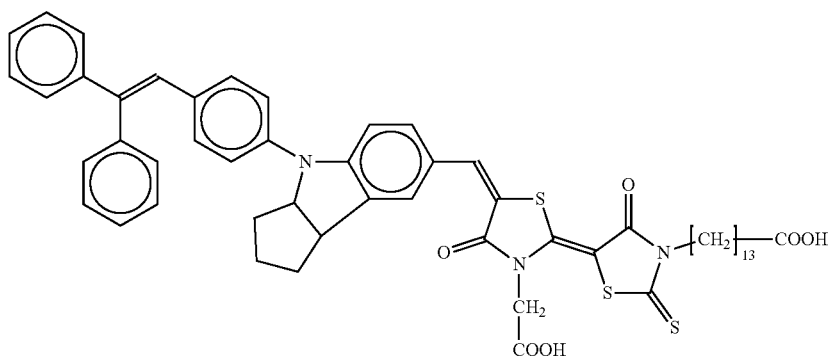

Used as a method for making the photosensitizing material 5 adsorbed on the electron-transporting layer 4 is a method where an electron collector electrode including semiconductor particles is dipped in a solution or dispersion liquid of a photosensitizing material, or a method where the solution or dispersion liquid is applied to make the photosensitizing material adsorbed on the electron-transporting layer.

In the former case, an immersing method, a dipping method, a roller method, or an air-knife method can be used.

In the latter case, a wire bar method, a slide hopper method, an extrusion method, a curtain method, a spin method, or a spray method can be used.

Moreover, adsorption may be performed in supercritical fluid using carbon dioxide.

When the photosensitizing material is adsorbed, a condensing agent may be used in combination.

The condensing agent may be a substance that exhibits a catalytic function of physically or chemically bonding the photosensitizing compound onto a surface of the electron-transporting compound, or a substance that acts stoichiometrically to cause a chemical equilibrium to move in an advantageous manner. Moreover, thiol or a hydroxyl compound may be added as a condensing aid.

Examples of a solvent in which the photosensitizing material is dissolved or dispersed include water, alcohol-based solvents (methanol, ethanol, and isopropyl alcohol), ketone-based solvents (e.g., acetone, methyl ethyl ketone, and methyl isobutyl ketone), ester-based solvents (e.g., ethyl formate, ethyl acetate, and n-butyl acetate), ether-based solvents (e.g., diethyl ether, dimethoxy ethane, tetrahydrofuran, dioxolane, and dioxane), amide-based solvents (e.g., N,N-dimethylformamide, N,N-dimethylacetoamide, and N-methyl-2-pyrrolidone), halogenated hydrocarbon-based solvents (e.g., dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene), and hydrocarbon-based solvents (e.g., n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene). The above-listed examples may be used alone or in combination as a mixture.

Moreover, some of photosensitizing materials function more effectively if aggregation between particles of the compound is suppressed, depending on a type of the compound for use. Therefore, an aggregation release agent may be used in combination.

The aggregation release agent is preferably a steroid compound (e.g., cholic acid and chenodeoxycholic acid), long-chain alkyl carboxylic acid, or long-chain alkyl phosphonic acid. The aggregation release agent is appropriately selected depending on the photosensitizing material for use.

An amount of the aggregation release agent added is preferably 0.01 parts by mass or greater but 500 parts by mass or less, and more preferably 0.1 parts by mass or greater but 100 parts by mass or less relative to 1 part by mass of the photosensitizing material.

A temperature at the time the photosensitizing material or a combination of the photosensitizing material and the aggregation release agent is adsorbed using the above is −50 degrees Celsius or higher but 200 degrees Celsius or lower. Moreover, the adsorption may be performed with being still or stirring.

Examples of a method when the stirring is performed include stirring using a stirrer, a ball mill, a paint conditioner, a sand mill, an attritor, or a disperser, and ultrasonic wave dispersion. The method is not limited to the above-listed examples. The time required for the adsorption is preferably 5 seconds or longer but 1,000 hours or shorter, more preferably 10 seconds or longer but 500 hours or shorter, and more preferably 1 minute or longer but 150 hours or shorter. Moreover, the adsorption is preferably performed in the dark.

<Ceramic Film>

As the ceramic film 6 in the solar battery cell and a production method of the ceramic film, matters described for the ceramic film of the photoelectric conversion device of the present disclosure and a production method thereof can be appropriately selected and applied.

<Second Electrode>

A second electrode is disposed after forming the ceramic film.

As the second electrode, moreover, an identical electrode to the above-described first electrode can be typically used. In a structure where a strength and sealability are sufficiently secured, the second electrode does not always need a support.

Specific examples of a material of the second electrode include: metals, such as platinum, gold, silver, copper, and aluminium; carbon-based compounds, such as graphite, fullerene, carbon nanotubes, and graphene; conductive metal oxides, such as ITO, FTO, and ATO; and conductive polymers, such as polythiophene and polyaniline.

An average thickness of the second electrode layer is not particularly limited. Moreover, the above-listed materials may be used alone or in combination.

The second electrode can be formed on the hole-transporting layer by an appropriate method, such as coating, laminating, vapor deposition, CVD, and bonding, depending on a material for use or a type of the hole-transporting layer.

In order to function as a photoelectric conversion device (photoelectric conversion element), either the first electrode or the second electrode, or both the first electrode and the second electrode are substantially transparent.

In the present disclosure, it is preferable that the first electrode side of the photoelectric conversion device be transparent and incident light enter from the side of the first electrode side. In this case, a material that reflects light is preferably used at the side of the second electrode, and the material is preferably glass or plastic to which a metal or a conductive oxide are deposited through vapor deposition or a metal thin film.

Moreover, it is effective to dispose an anti-reflection layer at the side from which sun light enters.

The photoelectric conversion element of the present disclosure is applied for a solar battery cell and a power supply device equipped with the solar battery cell. Application examples are not limited as long as applied products are solar battery cells known in the art or devices utilizing a power supply device equipped with the solar battery cell. For example, the photoelectric conversion element may be used as a solar battery cell for calculators and watches. One example for using the characteristics of the photoelectric conversion element of the present disclosure includes a power supply device of a mobile phone, an electronic organizer, or an electronic paper. Moreover, the power supply device including the photoelectric conversion element of the present disclosure can also be used as an auxiliary power supply intended for extending a continuously usable time of chargeable or dry cell-operated electric appliances. Moreover, the photoelectric conversion element can be used as a primary battery cell alternative combined with a secondary battery cell, as a stand-alone power source for a sensor.

(Organic Electroluminescence Element)

One embodiments of the photoelectric conversion device of the present disclosure is an organic electroluminescence (EL) element.

The organic EL element includes a conductive support, a charge-transporting layer including an organic charge-transporting material on the conductive support, and a ceramic film on the charge-transporting layer. Moreover, the organic EL element further includes a positive electrode (first electrode), a hole-transporting layer, a light-emitting layer, and a negative electrode (second electrode). The organic EL element may further include other layers, such as a barrier film, according to the necessity.

Note that, a layer including a positive electrode (first electrode), a hole-transporting layer, a light-emitting layer, an electron-transporting layer as the charge-transporting layer, and a negative electrode (second electrode) may be referred to as an "organic EL layer."

An example where the photoelectric conversion device is an organic EL element will be described hereinafter. However, the photoelectric conversion device is not limited to the organic EL element and can be applied for other photoelectric conversion devices.

FIG. 7 illustrates an organic EL element 10C that is one embodiment of the photoelectric conversion device of the present disclosure. Provided is an organic EL element including a ceramic film disposed as the outermost surface layer of an organic EL layer. The organic EL element 10C includes a substrate 2 serving as the support, the organic EL layer 3, and a ceramic film 4.

Note that, the present disclosure is not limited to the embodiment below and may be changed, such as other embodiments, addition, modification, and deletion, within a range a person skilled in the art can achieve. Any embodiment is included in the scope of the present disclosure as long as the embodiment exhibits a function and effect of the present disclosure.

<Support (Substrate)>

A substrate 2 serving as the support is an insulating substrate. The substrate 2 may be a plastic substrate or a film-shaped substrate.

A barrier film may be disposed on a main surface 2a of the substrate 2.

For example, the barrier film may be a film formed of silicon, oxygen, and carbon, or a film formed of silicon, oxygen, carbon, and nitrogen. Examples of a material of the barrier film include silicon oxide, silicon nitrate, and silicon oxynitride. An average thickness of the barrier film is preferably 100 nm or greater but 10 micrometers or less.

<Organic EL Layer>

The organic EL layer 3 includes a light-emitting layer and is a functional part contributing to emission of a light-emitting layer, such as mobility of carrier and combination of carrier, according to voltage applied between the positive electrode and the negative electrode. For example, the organic EL layer is formed by laminating a positive electrode, a hole-transporting layer, a light-emitting layer, an electron-transporting layer, and a negative electrode in this order from the side of the supporting substrate 2. The organic EL layer 3 and organic EL element 300 illustrated in FIG. 1 are an organic EL layer and organic EL element of top-emission type where light is emitted from the side opposite to the side of the substrate 2.

The organic EL layer 3 is not particularly limited and may be appropriately selected from organic EL elements known in the art depending on the intended purpose.

A transparent electrode is disposed as the negative electrode.

The transparent electrode is formed of conductive metal oxide, such as $SnO_2$, $In_2O_3$, ITO, IZO, and ZnO:Al. In the case where the transparent electrode is used as a negative electrode, it is preferable that an uppermost layer of the organic EL layer be an electron-injection layer to electron injection efficiency. The transmittance of the transparent electrode to light having wavelengths of 400 nm or longer but 800 nm or shorter is preferably 50% or greater and more preferably 85% or greater. An average thickness of the transparent electrode is preferably 50 nm or greater, more preferably 50 nm or greater but 1 micrometer or less, and more preferably 100 nm or greater but 300 nm or less.

<Ceramic Film>

As a ceramic film 4 of the organic EL element and a production method of the ceramic film, the matters described related to the ceramic film of the photoelectric conversion device of the present disclosure and the production method thereof are appropriable selected and applied.

The ceramic film 4 is disposed on a negative electrode in a manner that the organic EL layer 3 is embedded. The ceramic film 4 is disposed at the opposite side of the organic EL layer 3 to the side where the substrate 2 is disposed. The ceramic film 4 has a gas barrier function, particularly a moisture barrier function.

EXAMPLES

The present disclosure will be described in more detail by way of the following Examples and Comparative Examples. However, the present disclosure should not be construed as being limited to these Examples. Note that, "part(s)" described below means "part(s) by mass."

Example 1

—Production Example of Electrophotographic Photoconductor—

An electrophotographic photoconductor of Example 1, in which an intermediate layer, a charge-generating layer, a charge-transporting layer, and ceramic semiconductor film were disposed on a conductive support in this order as illustrated in FIG. 5, was produced in the following manner.

—Formation of Intermediate Layer—

The following intermediate layer coating liquid was applied onto a conductive support (outer diameter: 60 mm) formed of aluminium by dipping to form an intermediate layer. After drying the intermediate layer at 170 degrees Celsius for 30 minutes, an average thickness of the intermediate layer was 5 micrometers.

(Intermediate Layer Coating Layer)

Zinc oxide particles (MZ-300, available from TAYCA CORPORATION): 350 parts 3,5-Di-t-butylsalicylic acid (TCI-D1947, available from Tokyo Chemical Industry Co., Ltd.): 1.5 parts Blocked isocyanate (SUMIDUR (registered trademark) 3175, available from Sumitomo Bayer Urethane Co., Ltd., solid content: 75% by mass): 60 parts Solution obtained by dissolving 20% by mass of a butyral resin in 2-butanone (BM-1, available from SEKISUI CHEMICAL CO., LTD.): 225 parts 2-Butanone: 365 parts —Formation of Charge-Generating Layer—

Onto the obtained intermediate layer, the following charge-generating layer was applied by dipping to form a charge-generating layer. An average thickness of the charge-generating layer was 0.2 micrometers.

(Charge-Generating Layer Coating Liquid)

Y-type titanyl phthalocyanine: 6 parts Butyral resin (S-LEC BX-1, available from SEKISUI CHEMICAL CO., LTD.): 4 parts 2-Butanone (available from KANTO CHEMICAL CO., INC.): 200 parts —Formation of Charge-Transporting Layer 1—

Onto the obtained charge-generating layer, the following Charge-Transporting Layer Coating Liquid 1 was applied by dipping to form Charge-Transporting Layer 1.

After drying at 135 degrees Celsius for 20 minutes, an average thickness of the charge-transporting layer was 22 micrometers.

(Charge-Transporting Layer Coating Liquid 1)

Bisphenol Z polycarbonate (PANLITE TS-2050, available from TEIJIN LIMITED): 10 parts Low molecular weight charge-transporting material represented by the following Structural Formula (6): 10 parts

[Chem.2]

Structural Formula (6)

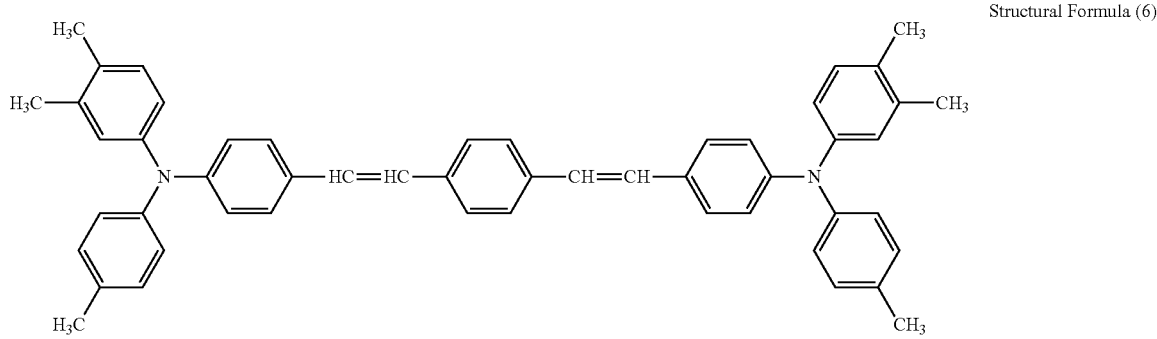

Tetrahydrofuran: 80 parts

—Formation of Ceramic Film 1—

(Delafossite)

Copper(I) oxide (available from Wako Pure Chemical Industries, Ltd.): 40.014 g

Alumina (AA-03, available from Sumitomo Chemical Co., Ltd.): 28.52 g

A thin film (film thickness: 1 micrometer) of copper aluminium oxide above was formed on quartz glass by the following method to thereby obtain a sample.

Next, the obtained sample was set in an X-ray diffraction spectrometer (MiniFlex600, available from Rigaku Corporation) to measure an X-ray diffraction spectrum of copper aluminium oxide. Note that, the measurement was performed by mounting a detector D/te X Ultra2 in the X-ray diffraction spectrometer. The result is illustrated in FIG. 9.

As illustrated in FIG. 9, the X-ray diffraction spectrum of the copper aluminium oxide has a peak at the diffraction angle 2-theta of 31.5 degrees or greater but 32.5 degrees or less, 35.5 degrees or greater but 37.5 degrees or less, or 45.5 degrees or greater but 47.5 degrees or less.

Moreover, a thin film having a film thickness of 1.7 micrometers was formed on an ITO glass using the copper aluminium oxide by the following method. To the resultant, a gold counter electrode was disposed by vacuum vapor deposition to thereby produce a sandwich-type cell.

The cell was set in a time of flight measuring device (TOF-401, available from Sumitomo Heavy Industries, Ltd. Mechatronics Division) to thereby measure hole mobility. Specifically, the hole mobility was $1 \times 10^4$ cm$^2$/Vsec when the time of flight measuring device was set to apply voltage of 34 V to the sample having an average thickness of 1.7 micrometers to control the magnetic field strength inside the sample to $2 \times 10^5$ V/cm.

The delafossite was prepared in the following manner. Copper(I) oxide and alumina were weighted and transferred into an empty mayonnaise bottle. The bottle was fixed on a sample stage of a vibration shaker (VIBRAX-VXR Basic, available from IKA), and was vibrated for 1 hour at vibration intensity of 1,500 rpm, followed by heating at 1,100 degrees Celsius for 24 hours, to thereby obtain copper aluminate. The obtained copper aluminate was ground by a motor, to thereby obtain a delafossite powder having a number average particle diameter of 1 micrometer.

As the film formation chamber, used was a modified device obtained by modifying a commercially available vapor deposition device (VPC-400, available from ULVAC, Inc.).

As the aerosol generator, a commercial available stirrer (T.K. AGI HOMO MIXER 2M-03, available from PRIMIX Corporation) was used. Note that, a device in which a commercially available pumping bottle (RBN-S, available from KSK CO., LTD.) having a volume of 1 L was disposed in an ultrasonic cleaner (SUS-103, available from Shimadzu Corporation) may be also used as the aerosol generator.

A pipe having an inner diameter of 4 mm was installed from the aerosol generator into the film formation chamber and a jet nozzle (YB1/8MSSP37, available from Spraying Systems Co.) was mounted at the edge of the pipe. A photoconductor was disposed at the position that was 2 mm away from the jet nozzle. As a photoconductor holder, a movable holder that could travel in the cross direction was used. As the jet nozzle, a movable jet nozzle that could travel in the longitudinal direction was used. An area of film formation could be determined by moving the photoconductor holder and the jet nozzle. Moreover, the aerosol generator and a gas cylinder filled with nitrogen were connected with a pipe having an inner diameter of 4 mm.

By means of the device above, Ceramic Film 1 having an average thickness of 1.0 micrometer was produced in the following manner.

The aerosol generator was charged with 40 g of the delafossite having the number average particle diameter of 1 micrometer. Next, the inner atmosphere of from the film formation chamber to the aerosol generator was made vacuum by the exhaust pump. Then, nitrogen gas was introduced from the gas cylinder into the aerosol generator and stirring was performed to generate an aerosol where the particles were dispersed in nitrogen gas. The generated aerosol was ejected from the jet nozzle towards the photoconductor via the pipe. The flow rate of the nitrogen gas was set to the range of 13 L/min or greater but 20 L/min or less. Moreover, the film formation duration was 20 minutes and the degree of vacuum in the film formation chamber during formation of Ceramic Film 1 was set to the approximate range of 50 Pa or greater but 150 Pa or less. The film formation of the predetermined film formation area was performed by moving the substrate holder and the jet nozzle.

The number average particle diameter of the delafossite was measured by analyzing an image obtained by a confocal microscope (OPTELICS H-1200, available from Lasertec Corporation).

Example 2

An electrophotographic photoconductor of Example 2 was produced in the same manner as in Example 1, except that Crosslinked Surface Layer 1 was formed instead of Ceramic Film 1 in the following manner, and Ceramic Film 1 was disposed and formed on Crosslinked Surface Layer 1.

—Formation of Crosslinked Surface Layer 1—

Onto the obtained charge-transporting layer, the following Crosslinked Surface Layer Coating Liquid 1 was applied by spray coating in a nitrogen air flow. The resultant was left to stand for 10 minutes in a nitrogen flow to set to touch.

The resultant was further dried for 20 minutes at 130 degrees Celsius. An average thickness of the resultant surface layer of the crosslinked resin was 4.5 micrometers.

(Crosslinked Surface Layer Coating Liquid 1)

Bisphenol Z polycarbonate (PANLITE TS-2050, available from TEIJIN LIMITED): 75 parts Aluminium oxide (SUMICORUNDUM AA03, available from Sumitomo Chemical Co., Ltd., average particle diameter: 300 nm): 25 parts Surfactant (BYK-P104, available from BYK): 0.5 parts Tetrahydrofuran: 1,330 parts Cyclohexanone: 570 parts Example 3

An electrophotographic photoconductor of Example 3 was produced in the same manner as in Example 1, except that Crosslinked Surface Layer 2 was formed instead of Ceramic Film 1 in the following manner, and Ceramic Film 1 was disposed and formed on Crosslinked Surface Layer 2.

—Formation of Crosslinked Surface Layer 2—

Onto the obtained charge-transporting layer, the following Crosslinked Surface Layer Coating Liquid 2 was applied by spray coating in a nitrogen air flow. The resultant was left to stand for 10 minutes in a nitrogen flow to set to touch. Thereafter, light irradiation was performed under the following conditions in a UV irradiation booth purged with nitrogen to make an oxygen concentration inside the booth 2% or less. The resultant was further dried for 20 minutes at 130 degrees Celsius. An average thickness of the resultant surface layer of the crosslinked resin was 4.5 micrometers.

(Light Irradiation Conditions)
Metal halide lamp: 160 W/cm
Irradiation distance: 120 mm
Irradiation intensity: 700 mW/cm$^2$
Irradiation duration: 60 seconds (Crosslinked Surface Layer Coating Liquid 2)

Trimethylolpropane triacrylate (KAYARAD TMPTA, available from Nippon Kayaku Co., Ltd., acrylic equivalent: 99, trivalent or higher radical polymerizable compound having no charge-transporting structure): 5 parts Dipentaerythritol caprolactone-modified hexaacrylate (KAYARAD DPCA-120, available from Nippon Kayaku Co., Ltd., acrylic equivalent: 324): 5 parts Radical polymerizable compound represented by the following Structural Formula (7) (monofunctional radical polymerizable compound having a charge-transporting structure, acrylic equivalent: 420): 10 parts

[Chem.3]

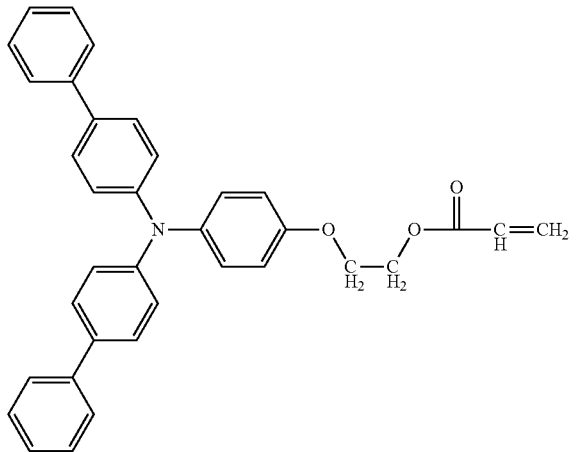

Structural Formula (7)

1-Hydroxy-cyclohexyl-phenyl-ketone (IRGACURE 184, available from Chiba Specialty Chemicals, photopolymerization initiator): 1 part Tetrahydrofuran: 100 parts Example 4

An electrophotographic photoconductor of Example 4 was produced in the same manner as in Example 1, except that Charge-Transporting Layer 1 was replaced by Charge-Transporting Layer 2 produced in the following manner.

—Formation of Charge-Transporting Layer 2—
(Charge-Transporting Layer Coating Liquid 2)
Delafossite having the number average particle diameter of 1 micrometer: 68.534 g
Silica (available from ULVAC, Inc.): 68.534 g As the film formation chamber, a modified device obtained by modifying a commercially available vapor deposition device (VPC-400, available from ULVAC, Inc.) was used.

As the aerosol generator, a commercial available stirrer (T.K. AGI HOMO MIXER 2M-03, available from PRIMIX Corporation) was used.

A pipe having an inner diameter of 4 mm was installed from the aerosol generator into the film formation chamber and a jet nozzle (YB1/8MSSP37, available from Spraying Systems Co.) was mounted at the edge of the pipe. A photoconductor was disposed at the position that was 2 mm away from the jet nozzle. As a photoconductor holder, a movable holder that could travel in the cross direction was used. As the jet nozzle, a movable jet nozzle that could travel in the longitudinal direction was used. An area of film formation could be determined by moving the photoconductor holder and the jet nozzle. Moreover, the aerosol generator and a gas cylinder filled with nitrogen were connected with a pipe having an inner diameter of 4 mm.

By means of the device above, Charge-Transporting Layer 2 having an average thickness of 1.0 micrometer was produced in the following manner.

The aerosol generator was charged with Charge-Transporting Layer Coating Liquid 2. Next, the inner atmosphere of from the film formation chamber to the aerosol generator was made vacuum by the exhaust pump. Then, nitrogen gas was introduced from the gas cylinder into the aerosol generator and stirring was performed to generate an aerosol where the particles were dispersed in nitrogen gas. The generated aerosol was ejected from the jet nozzle towards the photoconductor via the pipe. The flow rate of the nitrogen gas was set to the range of 13 L/min or greater but 20 L/min or less. Moreover, the film formation duration was 60 minutes and the degree of vacuum in the film formation chamber during formation of the charge-transporting layer was set to the approximate range of 50 Pa or greater but 150 Pa or less. The film formation of the predetermined film formation area was performed by moving the substrate holder and the jet nozzle.

Example 5

An electrophotographic photoconductor of Example 5 was produced in the same manner as in Example 1, except that Ceramic Film 1 was replaced with Ceramic Film 2 produced in the following manner.

—Formation of Ceramic Film 2—

As a stratification chamber, a modified device obtained by modifying a commercially available vapor deposition device (VPC-400, available from ULVAC, Inc.) was used. As the aerosol generator, a commercially available stirrer (T.K. AGI HOMO MIXER 2M-03, available from PRIMIX Corporation) was used.

A pipe having an inner diameter of 4 mm was installed from the aerosol generator into the stratification chamber and a jet nozzle (YB1/8MSSP37, available from Spraying Systems Co.) was mounted at the edge of the pipe. A photoconductor was disposed at the position that was 2 mm away from the jet nozzle. As a photoconductor holder, a movable holder that could travel in the cross direction was used. As the jet nozzle, a movable jet nozzle that could travel in the longitudinal direction was used. An area of stratification could be determined by moving the photoconductor holder and the jet nozzle. Moreover, the aerosol generator and a gas cylinder filled with nitrogen were connected with a pipe having an inner diameter of 4 mm.

By means of the device above, Ceramic Film 2 having an average thickness of 1.0 micrometer was produced in the following manner.

The aerosol generator was charged with 40 g of an alumina powder (available from Sumitomo Chemical Co., Ltd.) having the number average particle diameter of 1 micrometer. Next, the inner atmosphere of from the film formation chamber to the aerosol generator was made vacuum by the exhaust pump. Then, nitrogen gas was introduced from the gas cylinder into the aerosol generator and stirring was performed to generate an aerosol where the particles were dispersed in nitrogen gas. The generated aerosol was ejected from the jet nozzle towards the photoconductor via the pipe. The flow rate of the nitrogen gas was set to the range of 13 L/min or greater but 20 L/min or less. Moreover, the film formation duration was 20 minutes and the degree of vacuum in the film formation chamber during formation of Ceramic Film 2 was set to the approximate range of 50 Pa or greater but 150 Pa or less. The film formation of the predetermined film formation area was performed by moving the substrate holder and the jet nozzle.

The number average particle diameter of the alumina powder was measured by analyzing an image obtained by a confocal microscope (OPTELICS H-1200, available from Lasertec Corporation).

Comparative Example 1

An electrophotographic photoconductor of Comparative Example 1 was produced in the same manner as in Example 1, except that Ceramic Film 1 was replaced with Crosslinked Surface Layer 2.

Comparative Example 2

An electrophotographic photoconductor of Comparative Example 2 was produced in the same manner as in Example 1, except that Ceramic Film 1 was replaced with a protective layer produced in the following manner.

—Formation of Protective Layer—
(Protective Layer Coating Liquid)
Bisphenol Z polycarbonate (PANLITE TS-2050, available from TEIJIN LIMITED): 100 parts
Aluminium (Al)-doped zinc oxide (Pazet CK, available from HakusuiTech Co., Ltd., average particle diameter: 34 nm): 33.3 parts
Surfactant (polymer of low molecular weight unsaturated polycarboxylic acid) (BYK-P105, available from BYK): 1.7 parts
Tetrahydrofuran: 2,667 parts
Cyclohexanone: 667 parts Note that, the protective layer coating liquid was prepared in the following manner.

First, a 50 mL container charged with 110 g of zirconia beads (average particle diameter: 0.1 mm) was charged with Al-doped zinc oxide, a surfactant, and cyclohexanone. The resultant mixture was vibrated and dispersed for 2 hours at the vibration conditions of 1,500 rpm, to thereby prepare a dispersion liquid in which the Al-doped zinc oxide was dispersed. Next, the dispersion liquid was transferred to a 50 mL container charged with 60 g of zirconia beads (average particle diameter: 5 mm), and dispersion was performed for 24 hours at the rotational speed of 200 rpm, to thereby prepare a mill base.

Then, the mill base was added to a tetrahydrofuran solution in which bisphenol Z polycarbonate was dissolved, to thereby prepare a protective layer coating liquid having the above-listed composition.

<Evaluation of Electrophotographic Photoconductor>

The electrophotographic photoconductors of Examples 1 to 5 and Comparative Examples 1 to 2 produced in the above-described manner were evaluated in the following manner. The evaluation results of each of the photoconductors are presented in Table 1.

<<Image Evaluation after $NO_2$ Exposure>>

First, the electrophotographic photoconductor was left to stand in a $NO_2$ atmosphere for the predetermined period to make $NO_2$ adsorb on a surface of the electrophotographic photoconductor. As the exposure conditions, conditions under which $NO_2$ adsorption was saturated on the adsorption sites near the surface of the electrophotographic photoconductor were researched. As a result, it was found that exposure performed for 24 hours in a chamber a concentration of which was controlled to 40 ppm was preferable. As the exposure conditions, therefore, the atmosphere was set to the atmosphere having the $NO_2$ concentration of 40 ppm and the exposure time was set to 24 hours.

For the image evaluation after $NO_2$ exposure, an image evaluation was performed using a modified product of Ricoh Pro C9110 (available from Ricoh Company Limited) modified in a manner that an initial idling process at the time of output was eliminated, using Protoner black C9100 was used, and using a sheet, an A3-size copy sheet (POD gloss coat, available from Oji Paper Co., Ltd.).

As output images, a pattern for evaluation was continuously printed on 3 sheets with half-tone at the timing after printing 0 sheets, 1,000 sheets, or 10,000 sheets. The dot reproducibility of the output image on the 3 sheets was confirmed with naked eyes and under a microscope, and evaluated based on the following evaluation criteria.

(Evaluation Criteria)
A: There was no change in the dot reproducibility of the output image on the 3 sheets and no problem.
B: There was a slight change in the dot reproducibility of the output image on the 3 sheets but it was not problematic on practical use.
C: There was a significant density difference in the dot reproducibility of the output image on the 3 sheets.

TABLE 1

| | Image evaluation The number of sheets on which the evaluation pattern was printed: 0 sheets | Image evaluation The number of sheets on which the evaluation pattern was printed: 1,000 sheets | Image evaluation The number of sheets on which the evaluation pattern was printed: 10,000 sheets |
|---|---|---|---|
| Ex. 1 | A | A | A |
| Ex. 2 | A | A | A |
| Ex. 3 | A | A | A |
| Ex. 4 | A | A | A |
| Ex. 5 | A | B | B |
| Comp. Ex. 1 | B | C | — |
| Comp. Ex. 2 | B | C | — |

It was found from the results of Table 1 that the electrophotographic photoconductors obtained in Examples 1 to 5 could obtain stable image quality even after $NO_2$ exposure. It was therefore found that the layer formed at the outermost surface of the electronic device of the present disclosure was suitably applied for a photoconductor and the photoconductor was a photoconductor having resistance against chemical hazards.

Example 6

—Production Example of Solar Battery Cell—
—Production of Titanium Oxide Semiconductor Electrode—

A dense hole-blocking layer 3 of titanium oxide was formed on an ITO-based glass substrate by reactive sputtering with oxygen gas using a target formed of metal titanium.

Next, the resultant was subjected for a bead mill treatment for 12 hours together with 3 g of titanium oxide (P90, available from NIPPON AEROSIL CO., LTD.), 0.2 g of acetyl acetone, 0.3 g of a surfactant (polyoxyethylene octylphenyl ether, available from Wako Pure Chemical Industries, Ltd.), 5.5 g of water, and 1.0 g of ethanol. The obtained dispersion liquid was added to 1.2 g of polyethylene glycol (#20,000) to prepare a paste.

The paste was applied onto the hole-blocking layer in a manner that an average thickness thereof was to be 1.5 micrometers. After drying the applied paste at room temperature, the paste was fired for 30 minutes at 500 degrees Celsius in air, to thereby form porous Electron-Transporting Layer 4.

—Production of Dye-Sensitized Solar Battery Cell—

The titanium oxide semiconductor electrode was dipped in an acetonitrile/t-butanol solution (volume ratio 1:1) including 0.5 mM of the compound represented by Structural Formula (5) (available from MITSUBISHI PAPER MILLS LIMITED) as an organic sensitizing dye, and the resultant was left to stand in the dark for 1 hour to make the organic sensitizing dye adsorbed, to thereby form a sensitizing dye electrode layer.

—Production of Ceramic Semiconductor Film—

As a film formation chamber, a modified device obtained by modifying a commercially available vapor deposition device (VPC-400, available from ULVAC, Inc.) was used.

As an aerosol generator, a commercially available stirrer (T.K. AGI HOMO MIXER 2M-03, available from PRIMIX Corporation) was used.

A pipe having an inner diameter of 4 mm was installed from the aerosol generator into the film formation chamber and a jet nozzle (YB1/8MSSP37, available from Spraying Systems Co.) was mounted at the edge of the pipe. A dye-sensitized solar battery cell was disposed at the position that was 2 mm away from the jet nozzle. As a holder, a movable holder that could travel in the cross direction was used. As the jet nozzle, a movable jet nozzle that could travel in the longitudinal direction was used. An area of film formation could be determined by moving the holder and the jet nozzle. Moreover, the aerosol generator and a gas cylinder filled with nitrogen were connected with a pipe having an inner diameter of 4 mm.

By means of the device above, a ceramic semiconductor film having an average thickness of 1.0 micrometer was produced on the semiconductor electrode bearing the organic sensitizing dye.

The aerosol generator was charged with 40 g of an alumina powder (available from Sumitomo Chemical Co., Ltd.) having a number average particle diameter of 1 micrometer. Next, the inner atmosphere of from the film formation chamber to the aerosol generator was made vacuum by the exhaust pump. Then, nitrogen gas was introduced from the gas cylinder into the aerosol generator and stirring was performed to generate an aerosol where the particles were dispersed in nitrogen gas. The generated aerosol was ejected from the jet nozzle towards the semiconductor electrode via the pipe. The flow rate of the nitrogen gas was set to the range of 13 L/min or greater but 20 L/min or less. Moreover, the film formation duration was 20 minutes and the degree of vacuum in the film formation chamber during formation of the ceramic semiconductor film was set to the approximate range of 50 Pa or greater but 150 Pa or less. The formation of the ceramic semiconductor film of the predetermined film formation area was performed by moving the substrate holder and the jet nozzle.

Silver was deposited on the ceramic semiconductor film in the thickness of 100 nm by vacuum vapor deposition to produce a second electrode, to thereby produce a solar battery cell of Example 6.

Comparative Example 3

A solar battery cell of Comparative Example 3 was produced in the same manner as in Example 6, except that production of the following hole-transporting layer was performed instead of the production of the ceramic semiconductor film.

—Production of Hole-Transporting Layer—

An organic hole-transporting material represented by Structural Formula (8) below (compound name: 2,2',7,7'-tetrakis(N,N-di-p-methoxyphenylamino)-9,9'-spirobifluorene, product number: SHT-263, available from Merck KGaA): 95 mmol (solid content: 14% by mass) was dissolved in a chlorobenzene solution. The prepared solution was applied onto the semiconductor electrode bearing the organic sensitizing dye by spin coating to thereby form a hole-transporting layer.

Silver was deposited on the hole-transporting layer in the thickness of 100 nm by vacuum vapor deposition to produce a second electrode, to thereby produce a solar battery cell of Comparative Example 3.

[Chem.4]

Structural Formula (8)

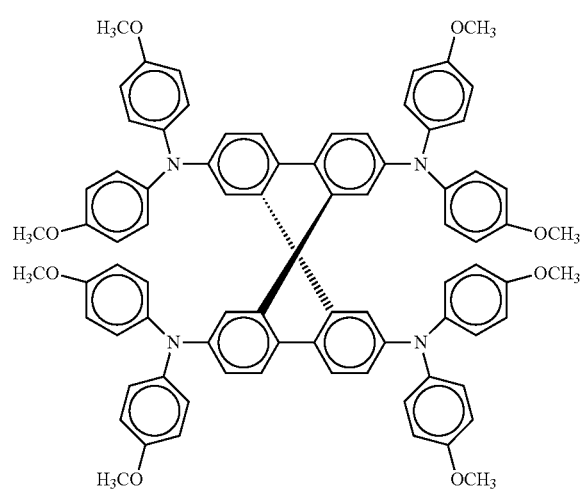

<Evaluation of Dye-Sensitized Solar Battery Cell>

The dye-sensitized solar battery cells of Example 6 and Comparative Example 3 obtained in the above-described manner were subjected to measurements of photoelectric conversion efficiency in the environment of 23 degrees Celsius and 55% RH, and after 24 hours under white LED irradiation (300 lux, 75 uW/cm$^2$). Next, the dye-sensitized solar battery cells were stored for 1 month in the environment of 30 degrees Celsius and 90% RH, followed by performing the measurement of photoelectric conversion efficiency in the same manner as above. A photoelectric conversion ratio reduction rate x from that measured at 23 degrees Celsius and 55% RH was determined by the following formula.

(Conversion reduction rate $x$)=(photoelectric conversion ratio after storing at 30 degrees Celsius and 90% RH)/(photoelectric conversion ratio at 23 degrees Celsius and 55% RH)   (Formula)

A desk lamp CDS-90 alpha (steady mode, available from Cosmotechno Co., Ltd.) was used as the white LED. A solar battery cell evaluation system As-510-PV03 (available from NF CORPORATION) was used as an evaluation device.

As a result, the solar battery cell produced in Example 6 had the photoelectric conversion ratio of 19.73% at 23 degrees Celsius and 55% RH and the photoelectric conversion ratio reduction rate x of 10%. The solar battery cell produced in Comparative Example 3 had the photoelectric conversion ratio of 20.11% at 23 degrees Celsius and 55% RH and the photoelectric conversion ratio reduction rate x of 25%.

Example 7

An organic EL element was produced according to Example 1 of Japanese Unexamined Patent Application Publication No. 2003-007473.

Specifically, indium-tin oxide (ITO) where a $SiO_2$ layer was formed as an underlying layer on a glass substrate by sputtering to obtain surface resistance of 15 ohm/square was used as a positive electrode. After sequentially washing with a neutral detergent, an oxygen-based detergent, and isopropyl alcohol, the resultant was set in a vacuum vapor deposition device and the internal gas was discharged until the degree of vacuum reached $1 \times 10^{-4}$ Pa. The following compound HTM-1 was deposited in the thickness of 40 nm as a hole-transporting layer, the following compound EM-1 was deposited in the thickness of 15 nm as a light-emitting layer, the following compound No. 1 was deposited in the thickness of 20 nm as a second electron-transporting layer, and 8-hydroxyquinolinol aluminium complex was deposited in the thickness of 30 nm as a first electron-transporting layer, where the deposition of the above-mentioned layers was sequentially performed by vapor deposition. Moreover, a mask was set on the substrate and a negative electrode alloy of Mg:Ag=10:1 (vapor deposition speed ratio) was formed in the thickness of 200 nm, to thereby produce an EL element having a light-emitting area of 2 mm×2 mm. Note that, the vapor deposition was performed with the substrate temperature being room temperature.

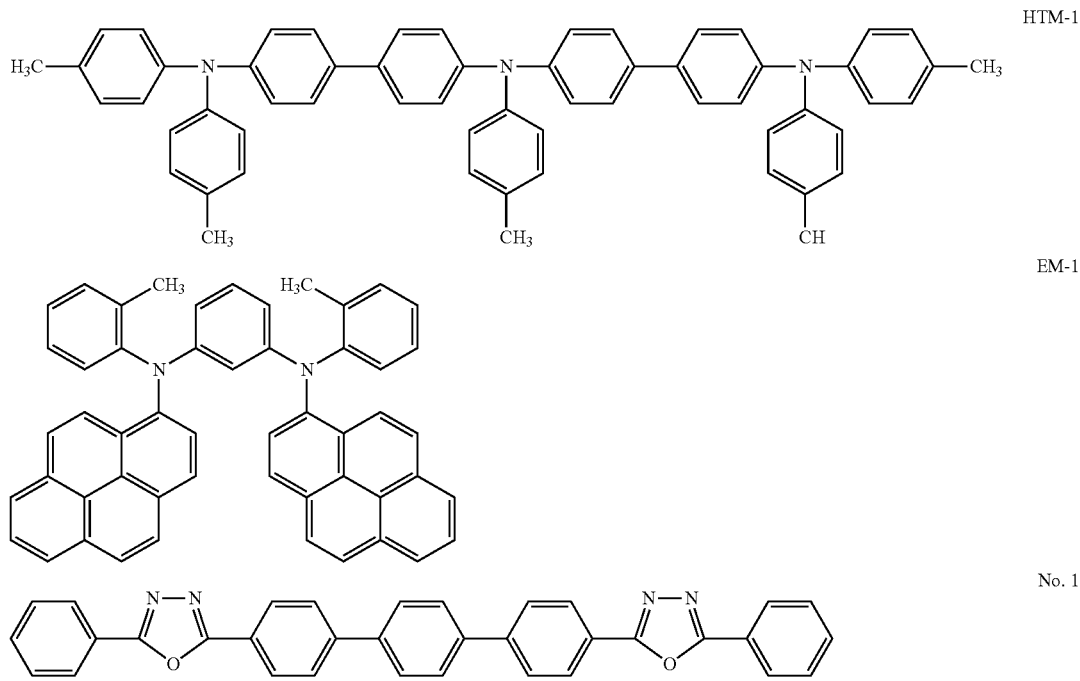

—Production of Ceramic Semiconductor Film—

After forming the negative electrode, a ceramic semiconductor film was produced in a nitrogen atmosphere (inert atmosphere) in the following manner without exposing to the atmosphere.

As a film formation chamber, a modified device obtained by modifying a commercially available vapor deposition device (VPC-400, available from ULVAC, Inc.) was used.

As an aerosol generator, a commercially available stirrer (T.K. AGI HOMO MIXER 2M-03, available from PRIMIX Corporation) was used.

A pipe having an inner diameter of 4 mm was installed from the aerosol generator into the film formation chamber and a jet nozzle (YB1/8MSSP37, available from Spraying Systems Co.) was mounted at the edge of the pipe. The organic EL element was disposed at the position that was 2 mm away from the jet nozzle. As a holder, a movable holder that could travel in the cross direction was used. As the jet nozzle, a movable jet nozzle that could travel in the longitudinal direction was used. An area of film formation could be determined by moving the holder and the jet nozzle. Moreover, the aerosol generator and a gas cylinder filled with nitrogen were connected with a pipe having an inner diameter of 4 mm.

By means of the device above, a ceramic semiconductor film having an average thickness of 1.0 micrometer was produced in the following manner.

The aerosol generator was charged with 40 g of zinc oxide particles (MZ-300, available from TAYCA CORPORATION). Next, the inner atmosphere of from the film formation chamber to the aerosol generator was made vacuum by the exhaust pump. Then, nitrogen gas was introduced from the gas cylinder into the aerosol generator and stirring was performed to generate an aerosol where the particles were dispersed in nitrogen gas. The generated aerosol was ejected from the jet nozzle towards the organic EL element via the pipe. The flow rate of the nitrogen gas was set to the range of 13 L/min or greater but 20 L/min or less. Moreover, the film formation duration was 20 minutes and the degree of vacuum in the film formation chamber during formation of the ceramic semiconductor film was set to the approximate range of 50 Pa or greater but 150 Pa or less. The formation of the ceramic semiconductor film of the predetermined film formation area was performed by moving the substrate holder and the jet nozzle.

Comparative Example 4

An organic EL element of Comparative Example 4 was produced in the same manner as in Example 7, except that the ceramic semiconductor film was not formed, and the organic EL layer where the positive electrode, the hole-injecting layer, the hole-transporting layer, the light-emitting layer, the electron-transporting layer, and the negative electrode were disposed in this order on the substrate was formed.

<Evaluation of Organic EL Element>

The organic EL elements of Example 7 and Comparative Example 4 produced in the above-described manner were driven to measure a life time thereof.

The life time was evaluated by LT80 that was represented by the time required until luminance was reduced to 80 from the initiation of the driving when the luminance at the time of initial driving was determined as 100. The measurement of the life time was performed by driving the organic EL element with the constant current of 10 mA/cm². The driving voltage is voltage when the organic EL element was driven at the constant current of 10 mA/cm². The current efficiency was a value when the luminance was 1000 cd/m² (i.e., 1,000 nit).

As a result of the measurement, the life time (LT80) of the organic EL element of Example 7 was 15 hours and the life time (LT80) of the organic EL element of Comparative Example 4 was 1 hour.

REFERENCE SIGNS LIST

10: electrostatic latent image bearer (electrophotographic photoconductor)
10B: solar battery cell
10C: organic electroluminescence element
100A: image forming apparatus
100B: image forming apparatus
110: process cartridge

The invention claimed is:

1. An electrophotographic photoconductor, comprising:
a support;
a charge-generating layer;
a charge-transporting layer including an organic charge-transporting material, where the charge-transporting layer is disposed on the support; and
a ceramic film disposed on the charge-transporting layer, wherein the ceramic film is a ceramic semiconductor film that includes delafossite not in particulate form, and wherein an X-ray diffraction spectrum of the ceramic semiconductor film has a peak at a diffraction angle 2-theta of 31.5 degrees or greater but 32.5 degrees or less, 35.5 degrees or greater but 37.5 degrees or less, or 45.5 degrees or greater but 47.5 degrees or less, and
wherein the ceramic film does not comprise a particulate ceramic.

2. The electrophotographic photoconductor according to claim 1, wherein charge mobility of the ceramic semiconductor film at magnetic field strength of $2 \times 10^5$ V/cm is $1 \times 10^{-6}$ cm²/Vsec or greater.

3. A process cartridge comprising:
the electrophotographic photoconductor according to claim 1.

4. An image forming apparatus comprising:
the electrophotographic photoconductor according to claim 1.

5. The electrophotographic photoconductor according to claim 1, wherein the organic charge-transporting material is at least one compound selected from the group consisting of a polymer including a carbazole ring, a polysilylene polymer, and an aromatic polycarbonate.

6. The electrophotographic photoconductor according to claim 1, wherein the charge-transporting layer is obtained by polymerization of a monofunctional radical polymerizable compound having a charge-transporting structure.

7. The electrophotographic photoconductor according to claim 6, wherein the charge-transporting structure comprises a triphenylamine derivative structure.

8. The electrophotographic photoconductor according to claim 1, wherein the ceramic film is obtained by a method comprising at least one process selected from the group consisting of a liquid phase growth, solid phase method, physical vapor deposition (PVD) method, and chemical vapor deposition.

9. A process cartridge comprising:
the electrophotographic photoconductor according to claim 1,
a developer configured to develop an electrostatic latent image on the electrophotographic photoconductor with a toner, thereby forming a toner image.

10. The process cartridge of claim 9, further comprising a photoconductor drum, a corona charger, a developing device, a transfer roller, and a cleaning device.

11. An image forming apparatus comprising:
the electrophotographic photoconductor according to claim 1,
an electrostatic latent image former, and
a developer.

12. The image forming apparatus of claim 11, further comprising a photoconductor drum, a charging roller, an exposing device, at least one developer, an intermediate transfer member, a cleaning device, and a charge-eliminating lamp.

* * * * *